(12) United States Patent
Jang et al.

(10) Patent No.: US 8,928,073 B2
(45) Date of Patent: Jan. 6, 2015

(54) SEMICONDUCTOR DEVICES INCLUDING GUARD RING STRUCTURES

(71) Applicant: Samsung Electronics Co., Ltd., Suwon-si (KR)

(72) Inventors: Se-myeong Jang, Gyeonggi-do (KR); Sang-hyun Han, Seoul (KR); Hyo-dong Ban, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/787,147

(22) Filed: Mar. 6, 2013

(65) Prior Publication Data

US 2013/0248997 A1    Sep. 26, 2013

(30) Foreign Application Priority Data

Mar. 20, 2012    (KR) ................. 10-2012-0028415

(51) Int. Cl.
*H01L 29/66*    (2006.01)
*H01L 27/088*    (2006.01)
*H01L 21/8234*    (2006.01)

(52) U.S. Cl.
CPC ...... *H01L 27/088* (2013.01); *H01L 21/823456* (2013.01); *H01L 21/823481* (2013.01)
USPC .......................................... 257/334; 257/409

(58) Field of Classification Search
CPC .................................................. H01L 29/0623
USPC ........................... 257/127, 170, 334, 409, 484
See application file for complete search history.

(56) References Cited

U.S. PATENT DOCUMENTS

| | | | |
|---|---|---|---|
| 7,595,262 | B2 | 9/2009 | Schlosser |
| 7,807,513 | B1 | 10/2010 | Kim et al. |
| 7,915,121 | B1 | 3/2011 | Kim |
| 7,928,504 | B2 | 4/2011 | Choi |
| 2002/0149977 | A1 | 10/2002 | Oh |
| 2009/0072289 | A1 | 3/2009 | Kim et al. |
| 2010/0240180 | A1 | 9/2010 | Jeon et al. |
| 2011/0115052 | A1* | 5/2011 | Sugioka ................. 257/532 |
| 2011/0260286 | A1* | 10/2011 | Lee et al. ............... 257/508 |

FOREIGN PATENT DOCUMENTS

| | | |
|---|---|---|
| JP | 07-066297 | 3/1995 |
| KR | 1020100110098 | 10/2010 |
| KR | 1020110067844 | 6/2011 |
| KR | 1020110078132 | 7/2011 |
| KR | 1020110080783 | 7/2011 |

* cited by examiner

*Primary Examiner* — Brook Kebede
(74) *Attorney, Agent, or Firm* — Myers Bigel Sibley & Sajovec, P.A.

(57) ABSTRACT

A semiconductor device includes a substrate partitioned into a cell region, a peripheral circuit region, and an interface region between the cell region and the peripheral circuit region. A guard ring is provided in the interface region of the substrate and surrounds the cell region. A first gate structure is in the cell region, and a second gate structure is in the peripheral circuit region.

19 Claims, 19 Drawing Sheets

SEMICONDUCTOR DEVICES INCLUDING GUARD RING STRUCTURES

CROSS-REFERENCE TO RELATED APPLICATIONS

This application claims the benefit of Korean Patent Application No. 10-2012-0028415, filed on Mar. 20, 2012, in the Korean Intellectual Property Office, the disclosure of which is incorporated herein in its entirety by reference.

BACKGROUND

The inventive concept relates to a semiconductor device and a method of manufacturing the semiconductor device, and more particularly, to a semiconductor device including a buried gate structure.

As the level of integration of semiconductor device increases and the size of semiconductor devices is reduced, a phenomenon referred to as the "short channel effect" may become more of a concern. The short channel effect can degrade the electrical characteristics of semiconductor devices. To address the issue of short channel effects, it has been suggested to form semiconductor devices having gate structures buried in a substrate instead of having conventional planar gate structures.

SUMMARY

The inventive concept provides a semiconductor device having improved electrical characteristics.

The inventive concept also provides methods of forming a semiconductor device having improved electrical characteristics.

According to an aspect of the inventive concept, there is provided a semiconductor device including a substrate divided into a cell region, a peripheral circuit region, and an interface region between the cell region and the peripheral circuit region; a guard ring in the interface region of the substrate and surrounding the cell region; a first gate structure in the cell region; and a second gate structure in the peripheral circuit region.

The guard ring may include a portion of the substrate defined by two adjacent isolation layers in the substrate.

An upper surface of the guard ring may be formed at the same level as that of an upper surface of the substrate, and a side wall of the guard ring may contact a side wall of the isolation layer.

The interface region may have a predetermined width, and the guard ring may occupy an entire portion of the interface region.

The first gate structure may include a first gate insulating layer on an inner wall of a trench that is formed in the substrate; a first gate electrode on the first gate insulating layer, and an upper surface of which is located at a level lower than that of an upper surface of the substrate; and a capping layer on the first gate electrode. The second gate structure may include a second gate insulating layer on the substrate; a second gate electrode on the second gate insulating layer; and a third gate electrode on the second gate electrode.

The semiconductor device may further include a bit line contact electrically connected to an impurity region that is adjacent to the first gate structure; and a bit line electrically connected to the bit line contact.

The width of the guard ring may be greater than a thickness of the second gate electrode.

The bit line may include a substantially same material as a material of the third gate electrode.

The bit line may be formed to a thickness that is substantially the same as a thickness of the third gate electrode.

According to another aspect of the present inventive concept, there is provided a semiconductor device including a substrate divided into a cell region, a peripheral circuit region, and an interface region between the cell region and the peripheral circuit region, wherein a recess is formed in the interface region; a plurality of first gate structures on the cell regions; and a second gate structure on the peripheral circuit region.

The semiconductor device may further include an isolation layer in the interface region, and the recess may be formed in an upper portion of the isolation layer.

The recess may have a predetermined depth from an upper surface of the substrate in a vertical direction.

A width of the recess may be less than or equal to a width of the interface region.

The second gate structure may include a gate insulating layer, a first gate electrode, and a second gate electrode that are sequentially formed on the substrate.

A width of the recess may be greater than or equal to a thickness of the first gate electrode.

A semiconductor device according to further embodiments includes a substrate including a cell region and a peripheral circuit region; an etch stop structure surrounding the cell region and defining an interface region between the cell region and the peripheral circuit region, wherein the etch stop structure comprises a portion of the substrate defined by at least one trench isolation layer surrounding the cell region; a first gate structure in the cell region; and a second gate structure in the peripheral circuit region.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
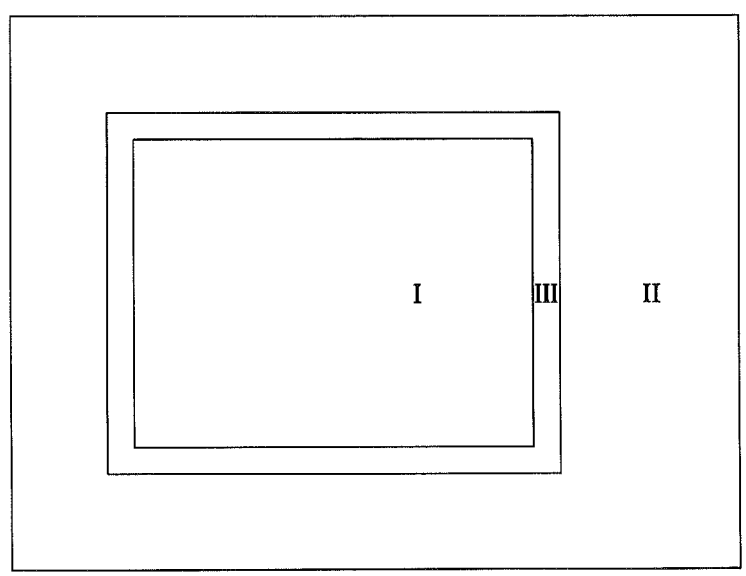
FIG. 1 is a plan view of a semiconductor device according to some embodiments of the present inventive concept.

The present invention will now be described more fully with reference to the accompanying drawings, in which embodiments of the invention are shown.

The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the thicknesses of layers and regions are exaggerated for clarity. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concepts.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Relative terms such as "between", "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures. In general, relative positional terms describing semiconductor structures may refer to positions relative to an underlying substrate.

Embodiments are described herein with reference to cross-section illustrations that are schematic illustrations of idealized embodiments (and intermediate structures). The thickness of layers and regions in the drawings may be exaggerated for clarity. Additionally, variations from the shapes of the illustrations as a result, for example, of manufacturing techniques and/or tolerances, are to be expected. Thus, embodiments illustrated herein should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

FIG. 1 is a plan view of a semiconductor device 100 according to some embodiments of the present inventive concept.

Referring to FIG. 1, the semiconductor device 100 may include a cell region I, a peripheral circuit region II, and an interface region III between the cell region I and the peripheral circuit region II. Semiconductor memory cell arrays (not shown) may be formed on the cell region I. Peripheral circuits (not shown) that are electrically connected to the memory cell arrays formed on the cell region I may be formed on the peripheral circuit region II. The interface region III may be formed around the cell region I to a predetermined width. In FIG. 1, the cell region I is disposed on a center portion, and the peripheral region II is disposed on an outer portion of the device 100. However, the present inventive concept is not limited thereto, and the cell region I and the peripheral circuit region II may be arranged in other configurations. In other embodiments, the peripheral region II may be disposed within the cell region I. In addition, it is referred to as 'peripheral region II' in FIG. 1; however, the peripheral region II may include a region on which the cell array is not formed, such as a core region.

Transistors of the cell arrays formed on the cell region I may be recessed channel array transistors (RCATs). A planar-type transistor may be formed on the peripheral circuit region II.

Figure 2A:
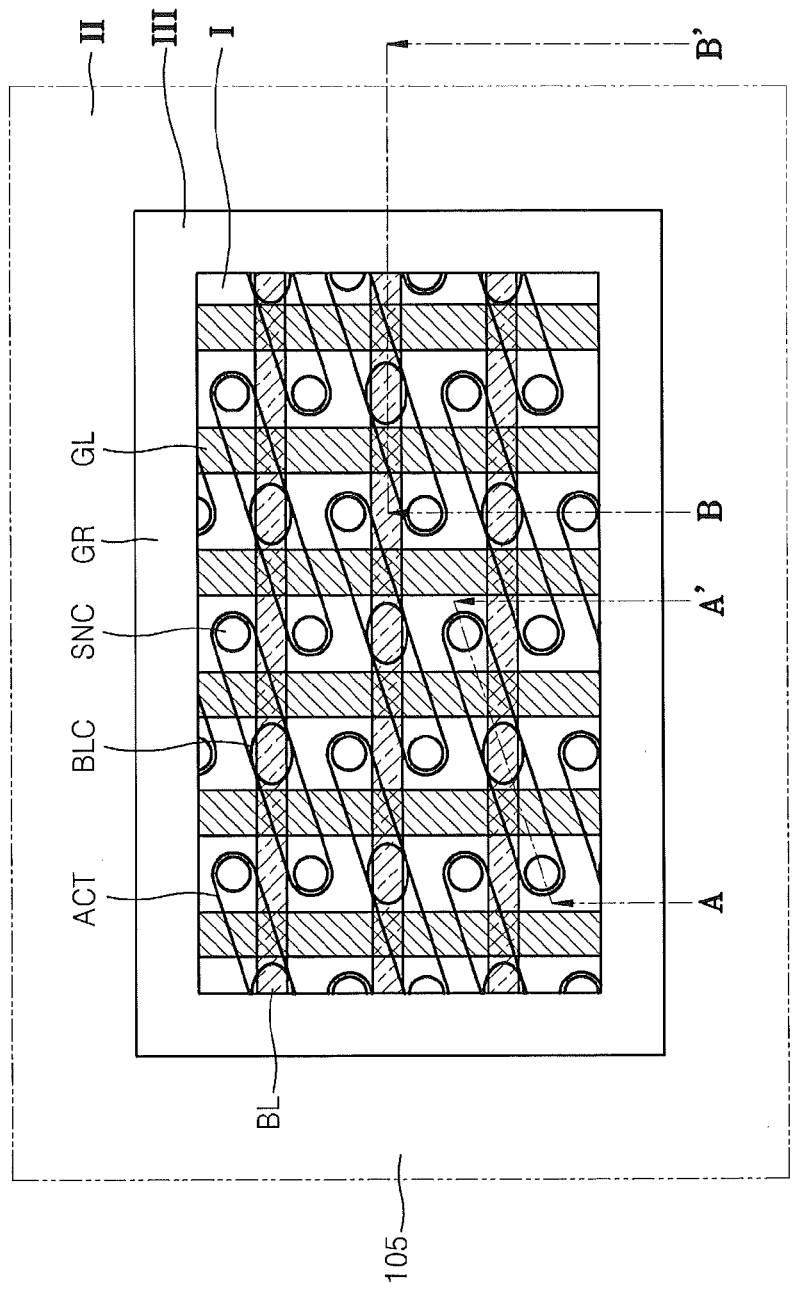
FIG. 2A is a schematic plan view showing a part of a cell area and a peripheral circuit area of the semiconductor device according to some embodiments of the present inventive concept.

FIG. 2A is a plan view schematically showing a part of the cell region I and the peripheral circuit region II of the semiconductor device 100 according to some embodiments.

Referring to FIG. 2A, a substrate 105 may be partitioned as the cell region I, the peripheral circuit region II, and the interface region III. A guard ring GR is formed on the interface region III of the substrate 105 to surround the cell region I. The guard ring GR may be formed to have a predetermined width according to design of devices formed on the cell region I and the peripheral circuit region II. The guard ring GR may be defined by an isolation layer (not shown). In FIG. 2A, the cell region I is formed as a rectangle and the guard ring GR surrounds edges of the cell region I on an entire portion of the interface region III; however, the guard ring GR may be formed on a partial area of the interface region III.

A plurality of active regions ACT, a plurality of gate lines GL, and a plurality of bit lines BL are arranged on the cell region I. The active regions ACT on which the gate lines GL are not formed may be source and drain regions. Storage node contacts (SNCs) may be formed on the source regions for electrically connecting a capacitor (not shown) to the source regions. In addition, bit line contacts (BLCs) may be formed on the drain regions for electrically connecting the drain regions to the bit lines BL.

The active regions ACT may be defined by the isolation layer. As shown in FIG. 2A, the active regions ACT may be arranged to extend at a given angle with respect to directions in which the bit lines BL and the gate lines GL extend.

The gate lines GL may be arranged to cross the active regions ACT. As shown in FIG. 2A, two gate lines GL may cross one active region ACT. In another embodiment, an arbitrary number of gate lines GL may be disposed to cross one active region ACT. As described above, the source and drain regions may be disposed in the active regions ACT located at opposite sides of the gate lines GL. In some embodiments, the drain region may be formed between the two gate lines GL crossing one active region ACT, and two source regions may be formed on outer portions of the two gate lines GL. The source and drain regions are formed by doping or ion-implanting the same impurities, and thus may be changed with each other according to a circuit configuration of a transistor that is to be formed.

The bit line contacts BLC may be formed on the drain regions. The bit line contacts BLC may electrically connect the drain regions to the bit lines BL. The bit line contacts BLC may be electrically separated from adjacent gate lines GL. In some embodiments, one bit line contact BLC formed on one active region ACT may be shared by transistors of the adjacent gate lines GL.

The bit lines BL may be arranged to be electrically connected to the bit line contacts BLC. In FIG. 2A, the bit lines BL are substantially perpendicular to the gate lines GL; however, the bit lines BL and the gate lines GL may be extended at a given angle with respect to each other.

The storage node contacts SNC may be formed on the source regions. As described above, the source regions may be electrically connected to storage regions (not shown), for example, capacitors, via the storage node contacts SNC.

Figure 2B:
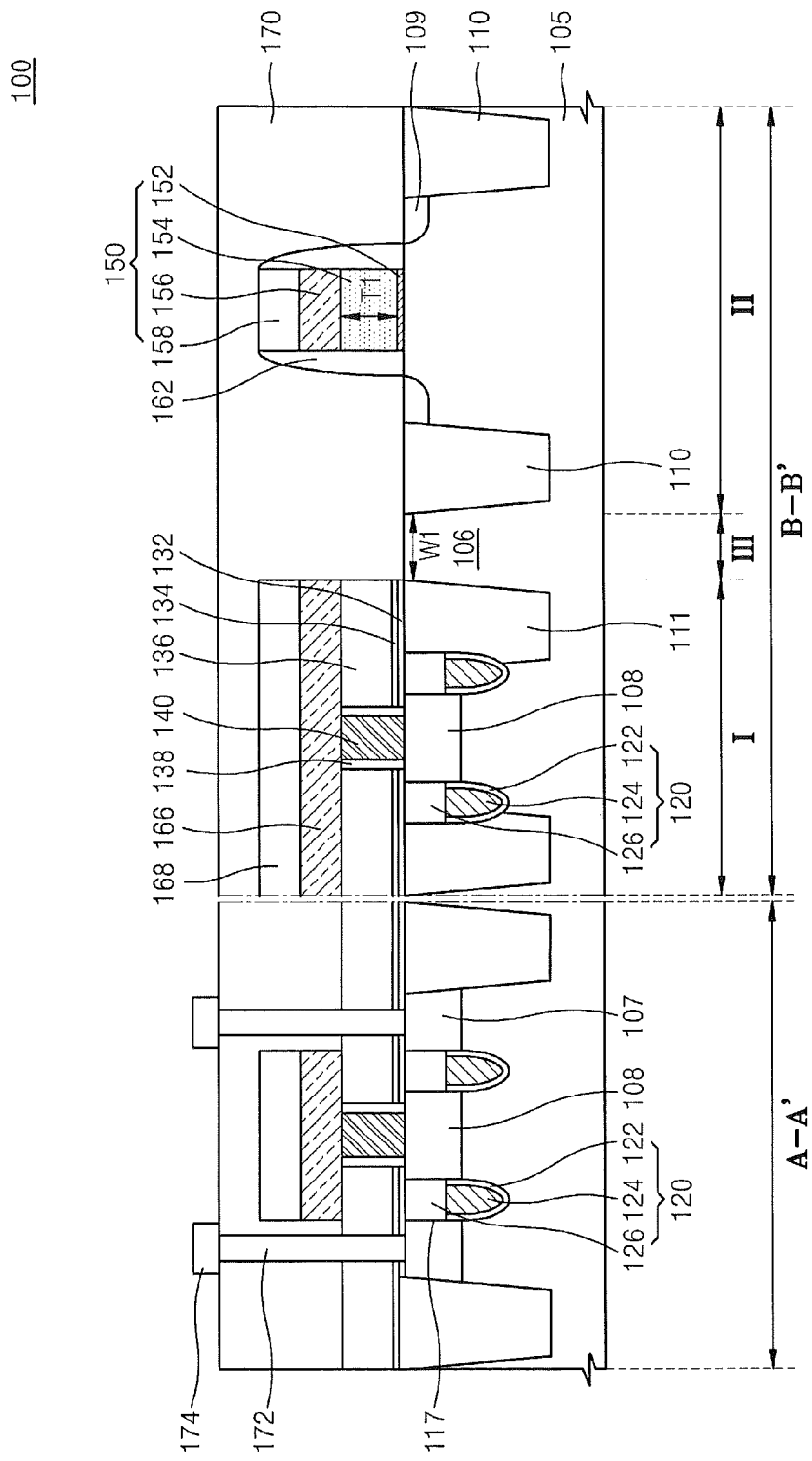
FIG. 2B is a cross-sectional view of the semiconductor device taken along lines A-A' and B'B' of FIG. 2A.

FIG. 2B is a cross-sectional view showing the semiconductor device 100 taken along line A-A' and line B-B' of FIG. 2A.

Referring to FIG. 2B along with FIG. 2A, a first gate structure 120 is formed on the cell region I, and a second gate structure 150 is formed on the peripheral circuit region II. The first gate structure 120 may be a buried-type gate structure having a gate electrode buried in the substrate 105, and the second gate structure 150 may be a planar-type gate structure formed on the substrate 105.

An isolation layer 110 may be provided on the substrate 105 to define the active regions and the guard ring 106 on the cell region I and the peripheral circuit region II. FIG. 2B shows that two first gate structures 120 are formed on the active region of the cell region I. The two first gate structures 120 may share one drain region 108 formed therebetween. Two source regions 107 may be formed on outer portions of the first gate structures 120.

Each of the first gate structures 120 may be formed in a trench 117 having a predetermined depth from an upper surface of the substrate 105, and may include a first gate insulating layer 122, a first gate electrode 124, and a capping layer 126. The first gate insulating layer 122 may be formed on an inner wall of the trench 117, and the first gate electrode 124 may be formed on the first gate insulating layer 122 and fills a lower portion of the trench 117. The capping layer 126 may be formed on the first gate electrode 124 and fills an upper portion of the trench 117.

The drain region 108 may be formed at an upper portion of the substrate 105 between two adjacent trenches 117, and the source regions 107 may be formed at upper portions of the substrate 105 on the outer portions of the trenches 117. Lower boundaries of the source regions 107 and the drain region 108 may be formed at a lower level than that of an upper surface of the first gate electrode 124.

A first buffer layer 132, an etch stop layer 134, and a first insulating interlayer 136 may be sequentially formed on the substrate 105 in the cell region I. Bit line contacts 140 may be electrically connected to the drain regions 108 by penetrating through the first insulating interlayer 136. Bit lines 166 may be formed on the first insulating interlayer 136, and may be electrically connected to the bit line contacts 140. A hard mask 168 may be further formed on the bit lines 166.

The guard ring 106 may be defined by two adjacent isolation layers 110, and may be formed on the interface region III between the cell region I and the peripheral circuit region II. An upper surface of the guard ring 106 may be located on the same plane as the upper surface of the substrate 105, and a side wall of the guard ring 106 may contact a side wall of the isolation layer 110. The guard ring 106 may have a predetermined width W1 and surround the entire cell region I. In some embodiments, the width W1 of the guard ring 106 may be equal to or greater than a thickness T1 of a second gate electrode 154 of the second gate structure 150.

The second gate structure 150 may be formed on the active regions of the peripheral circuit region II. The second gate structure 150 may include a second gate insulating layer 152, a second gate electrode 154, a third gate electrode 156, and a hard mask 158. A spacer 162 may be further formed on a side wall of the second gate structure 150.

The second gate electrode 154 may include a conductive material such as doped polysilicon, a metal, or a metal nitride. In some embodiments, the thickness T1 of the second gate electrode 154 may be smaller than the width W1 of the guard ring 106.

The third gate electrode 156 may include a conductive material such as doped polysilicon, a metal, and/or a metal nitride. In an some embodiments, the third gate electrode 156 may include the same material as the second gate electrode 154. Otherwise, the third gate electrode 156 may include a different material from that of the second gate electrode 154. For example, the second gate electrode 154 may be formed as a doped polysilicon layer, and the third gate electrode 156 may be formed of a metal nitride such as tungsten nitride.

The second gate insulating layer 152 may be formed of silicon oxide, silicon nitride, silicon oxynitride, and/or a high-k dielectric material such as a metal oxide. The hard mask 158 may include silicon nitride, and the spacer 162 may include silicon nitride.

A second insulating interlayer 170 may be formed on the substrate 105 to cover the first insulating interlayer 136, the bit lines 166, the hard mask layer 168, and the second gate structure 150. Storage node contacts 172 may be electrically connected to the source regions 107 by penetrating the first and second insulating interlayers 136 and 170. Storage regions 174, for example, the capacitors, may be formed on the storage node contacts 172.

According to the embodiment, the semiconductor device 100 may include the guard ring 106 at the interface region III between the cell region I and the peripheral circuit region II. Thus, processes of patterning the second gate electrode 154 may be performed easily due to the guard ring 106.

Figure 2C:
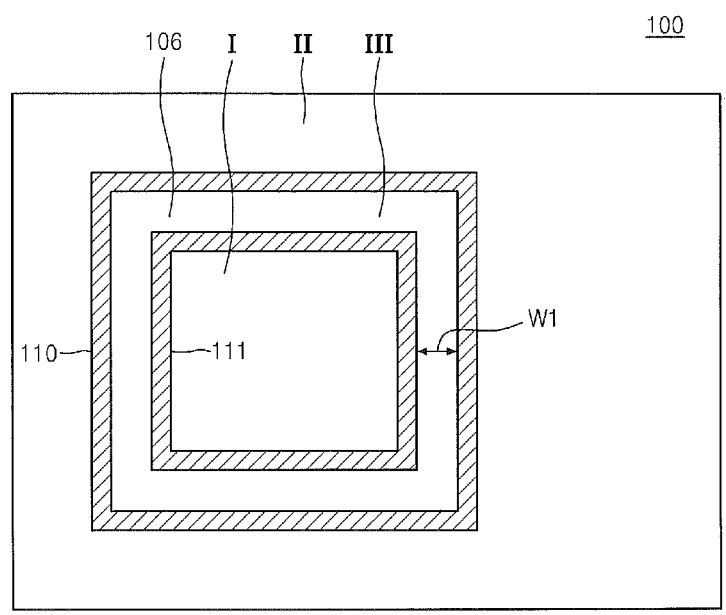
FIG. 2C is a plan view a semiconductor device according to some embodiments of the present inventive concept.

FIG. 2C is a plan view of the semiconductor device 100 showing the cell region I, the peripheral circuit region II and the interface region III. As shown therein, the interface region III is defined by first and second isolation layers 110, 111 that surround the cell region I and are spaced apart by a width W1.

Figure 3A:
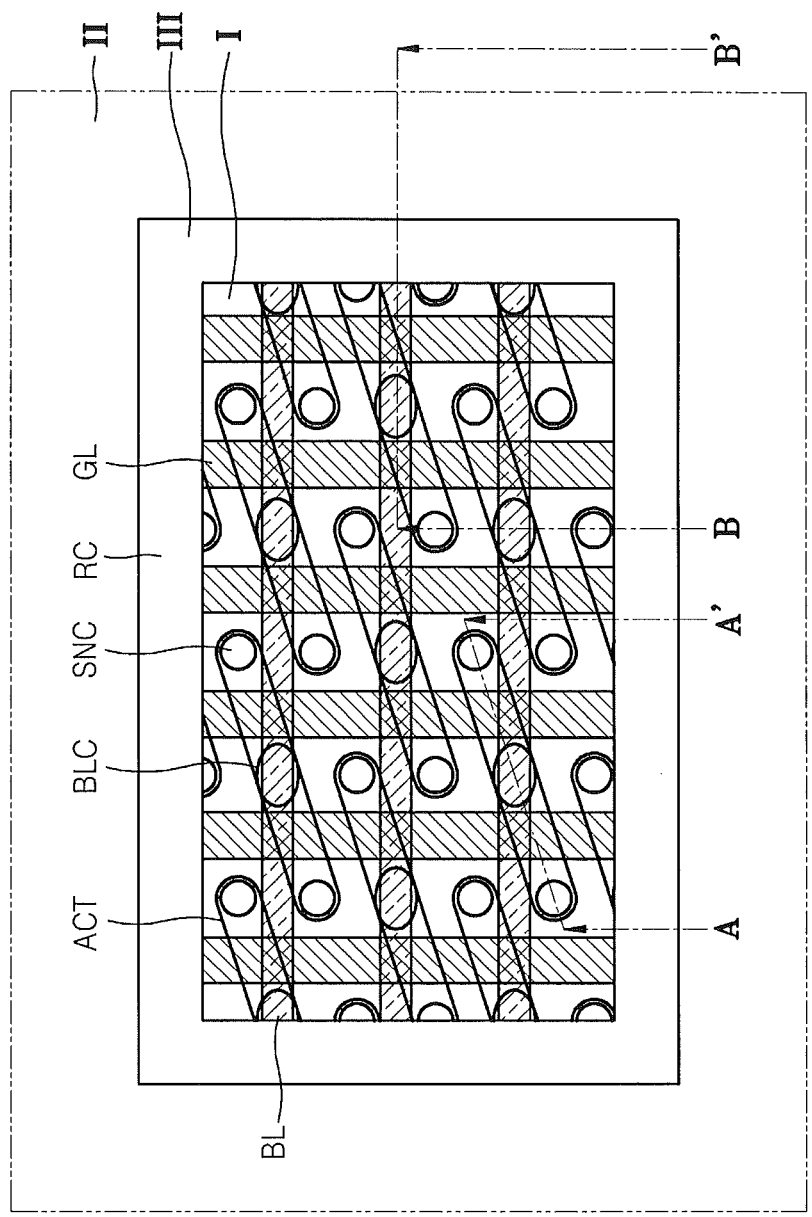
FIG. 3A is a plan view of a semiconductor device according to some embodiments of the present inventive concept.
Figure 3B:
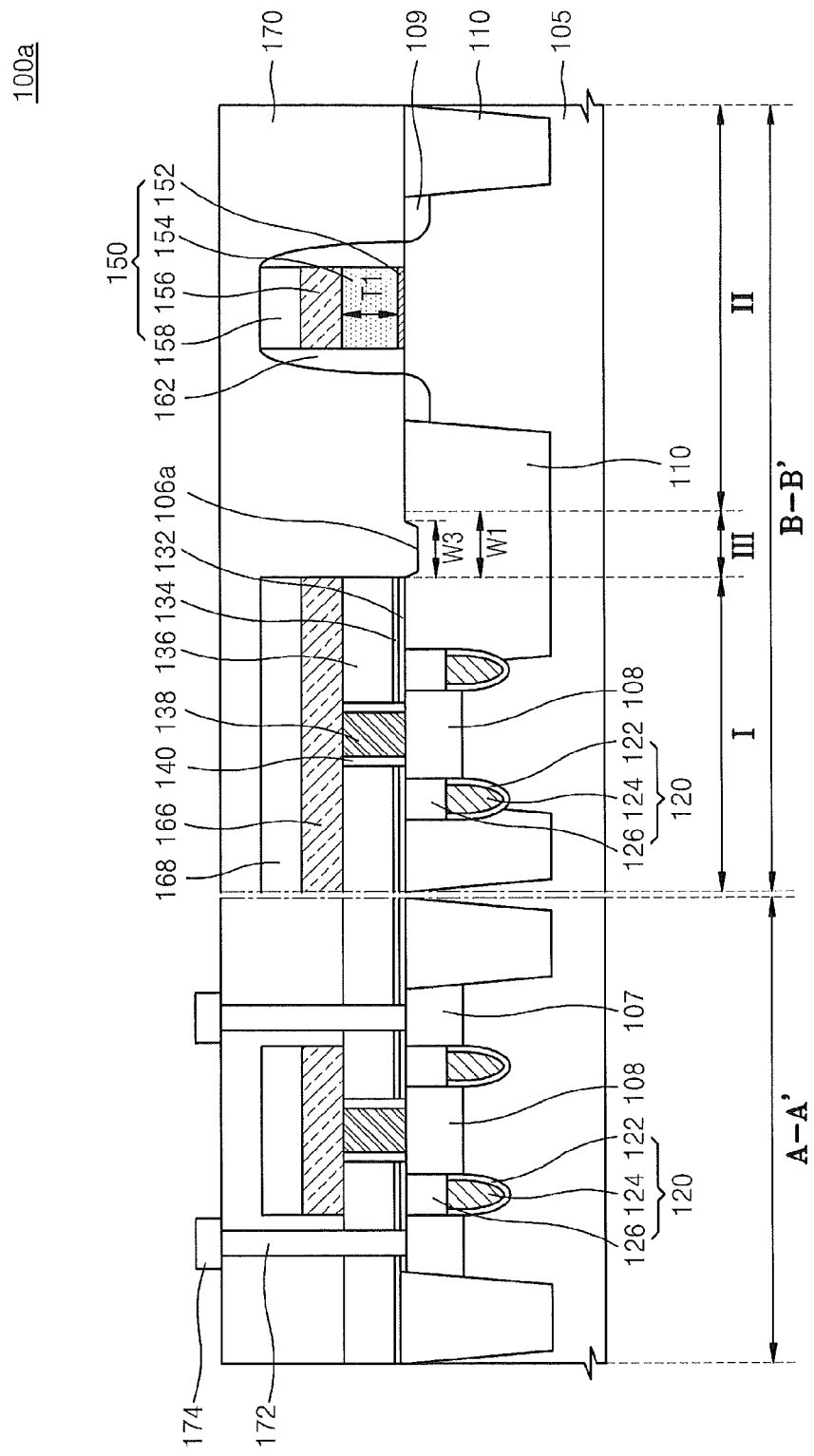
FIG. 3B is a cross-sectional view of the semiconductor device taken along lines A-A' and B-B' of FIG. 3A.

FIG. 3A is a plan view of a semiconductor device 100a according to another embodiment of the present inventive concept, and FIG. 3B is a cross-sectional view of the semiconductor device 100a taken along line A-A' and line B-B' of FIG. 3A. The semiconductor device 100a is similar to the semiconductor device 100 described with reference to FIGS. 2A and 2B, except that the semiconductor device 100a of the present embodiment includes recesses (RC) 106a instead of the guard ring.

Referring to FIGS. 3A and 3B, a substrate 105 may be partitioned as the cell region I, the peripheral circuit region II, and the interface region III. An isolation layer 110 for defining the active regions may be provided on the substrate 105. A first gate structure 120 may be formed on the cell region I, and a second gate structure 150 may be formed on the peripheral circuit region II. The isolation layer 110 may be formed on the interface region III, and a recess (RC) 106a may be formed on the isolation layer 110.

The first gate structure 120 may be formed in a trench 117 having a predetermined depth from an upper surface of the substrate 105, and may include a first gate insulating layer 122, a first gate electrode 124, and a first capping layer 126. A drain region 108 may be formed at an upper portion of the substrate 105 between two adjacent trenches 117, and source regions 107 may be formed at an upper portion of the substrate 105 on the outer portions of the trenches 117. Lower boundaries of the source and drain regions 107 and 108 may be formed at a lower level than that of an upper surface of the first gate electrode 124.

A first insulating interlayer 136 may be formed on the substrate 105 in the cell region I. Bit line contacts 140 may be electrically connected to the drain regions 108 by penetrating through the first insulating interlayer 136. Bit lines 166 may be formed on the first insulating interlayer 136, and may be electrically connected to the bit line contacts 140. A hard mask 168 may be further formed on upper surfaces of the bit lines 166.

The isolation layer 110 including the recess 106a at an upper portion thereof may be formed on the interface region III. As shown in FIG. 3A, the recess 106a may have a predetermined width W3 and surround the cell region I. The width W3 of the recess 106a may be equal to or greater than the thickness T1 of the second gate electrode 154 of the second gate structure 150.

The second gate structure 150 may be formed on the substrate 105 on the peripheral circuit region II. The second gate structure 150 may include a second gate insulating layer 152, a second gate electrode 154, a third gate electrode 156, and a hard mask 158 that are sequentially formed on the substrate 105. A spacer 162 may be further formed on a side wall of the second gate structure 150.

A second insulating interlayer 170 may be formed on the substrate 105 to cover the first insulating interlayer 136, the bit lines 166, the hard mask 168, and the second gate structure 150. Storage node contacts 172 may be electrically connected to the source regions 107 by penetrating through the first and second insulating interlayers 136 and 170. Storage regions 174, for example, capacitors, may be provided on the storage node contacts 172.

Figure 4A:
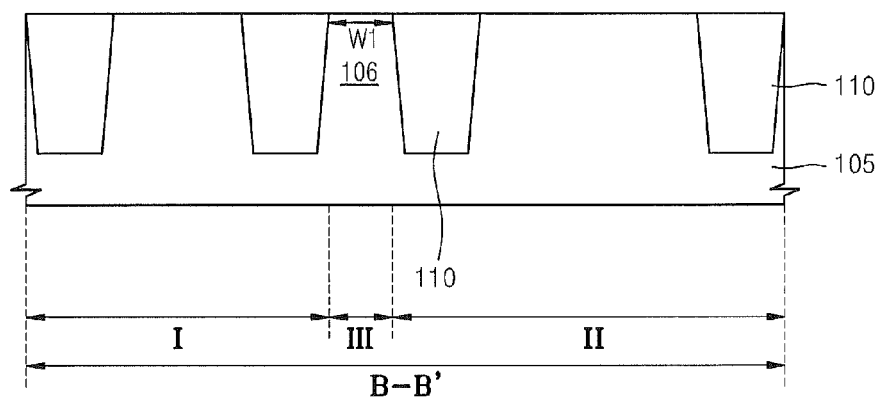
FIGS. 4A through 4Q are cross-sectional views illustrating methods of forming a semiconductor device according to some embodiments of the present inventive concept.
Figure 4B:
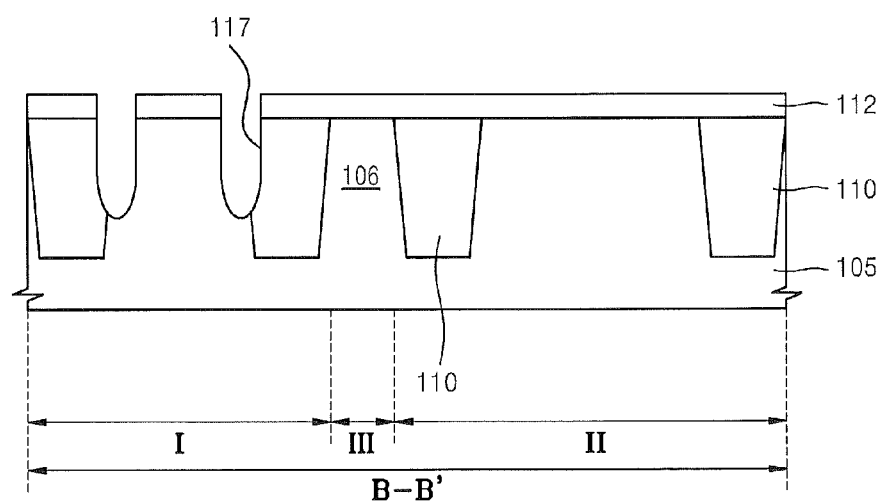
Figure 4C:
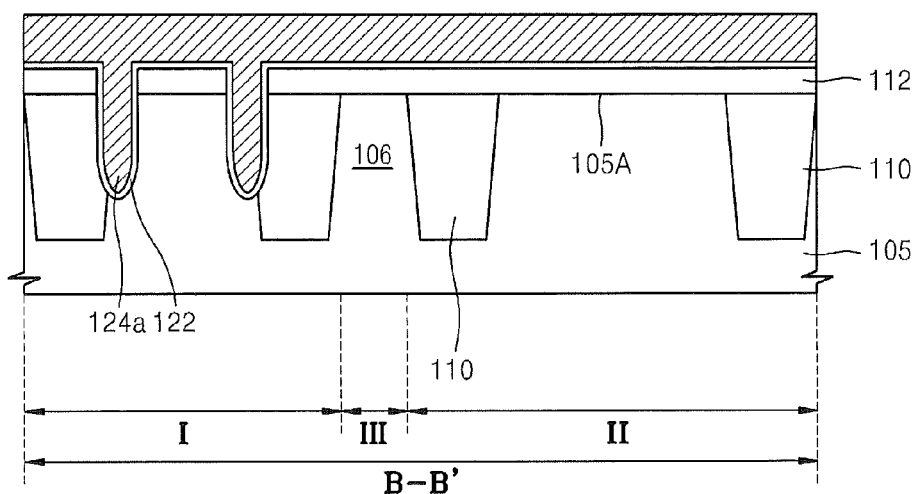
Figure 4D:
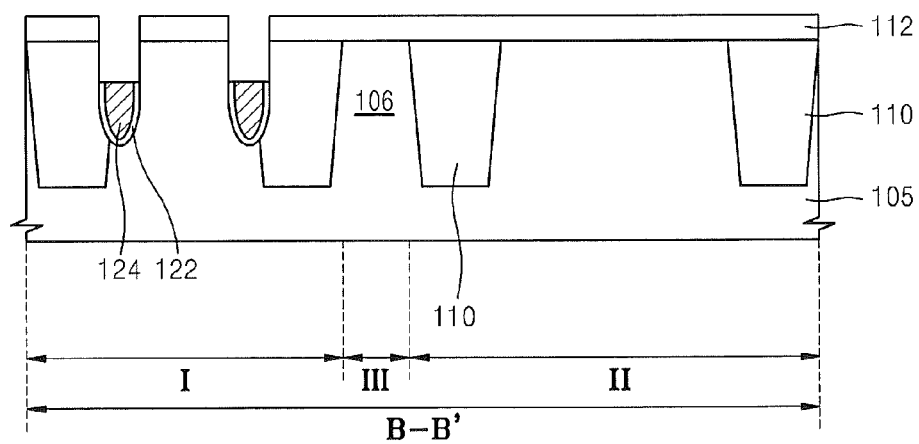
Figure 4E:
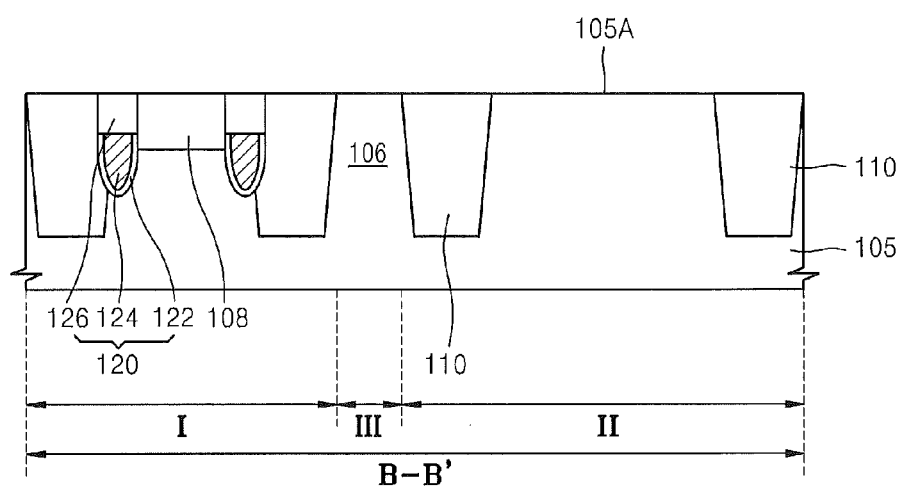
Figure 4F:
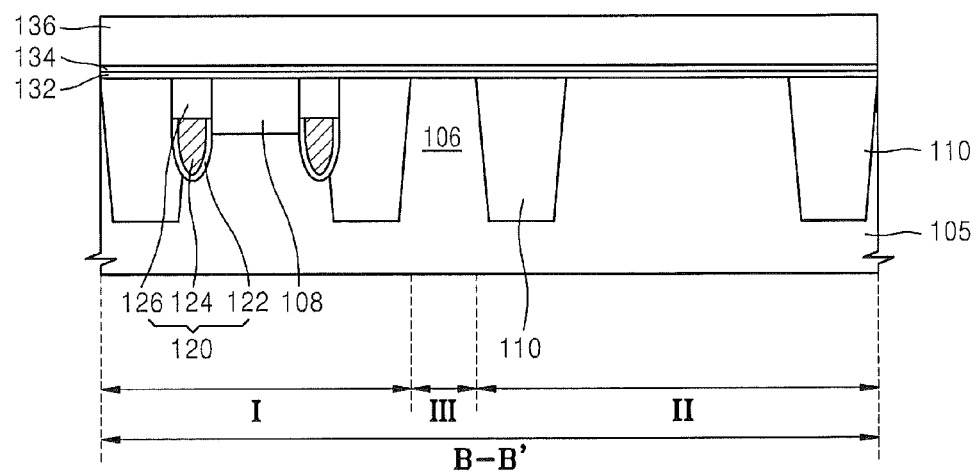
Figure 4G:
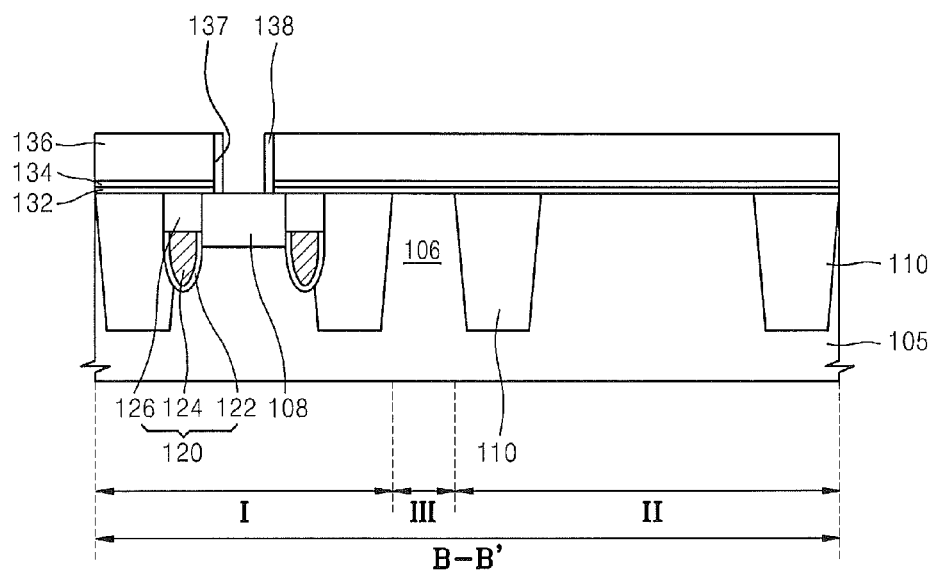
Figure 4H:
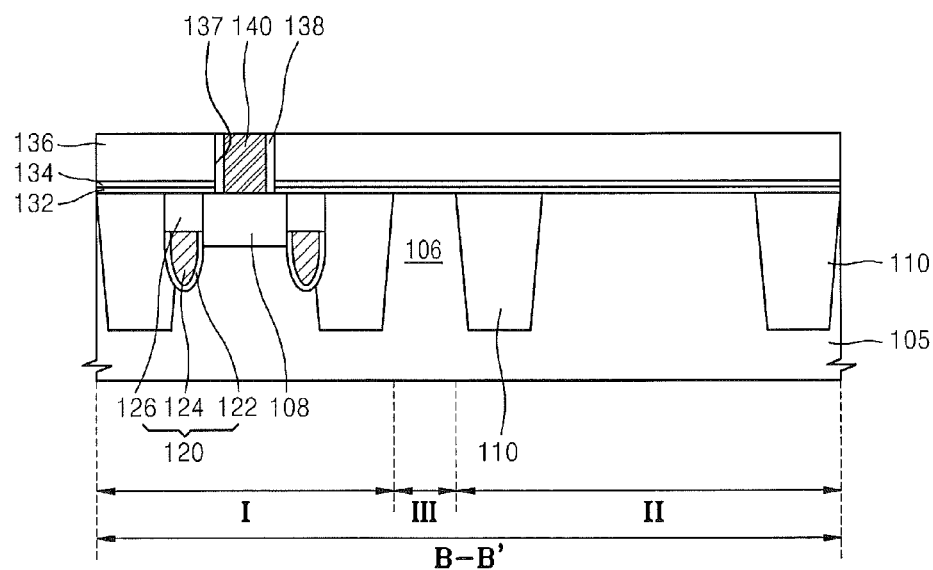
Figure 4I:
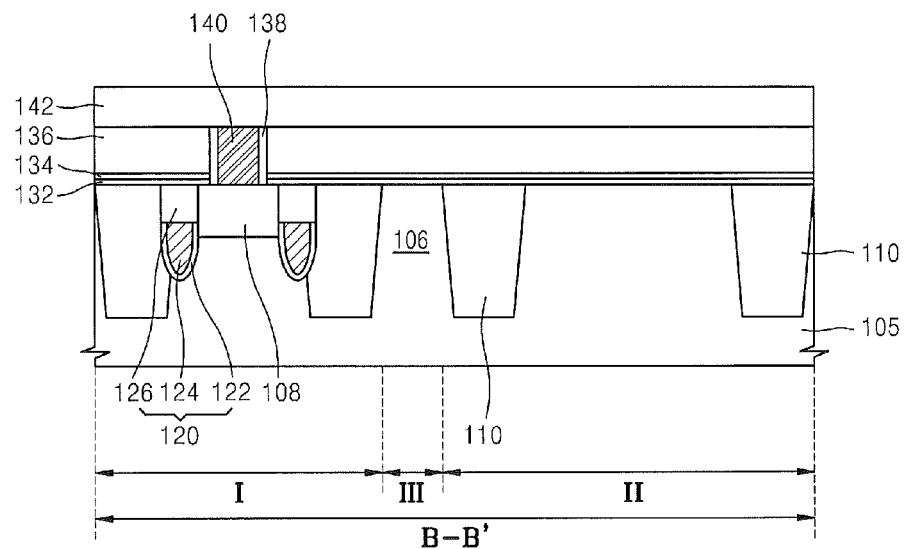
Figure 4J:
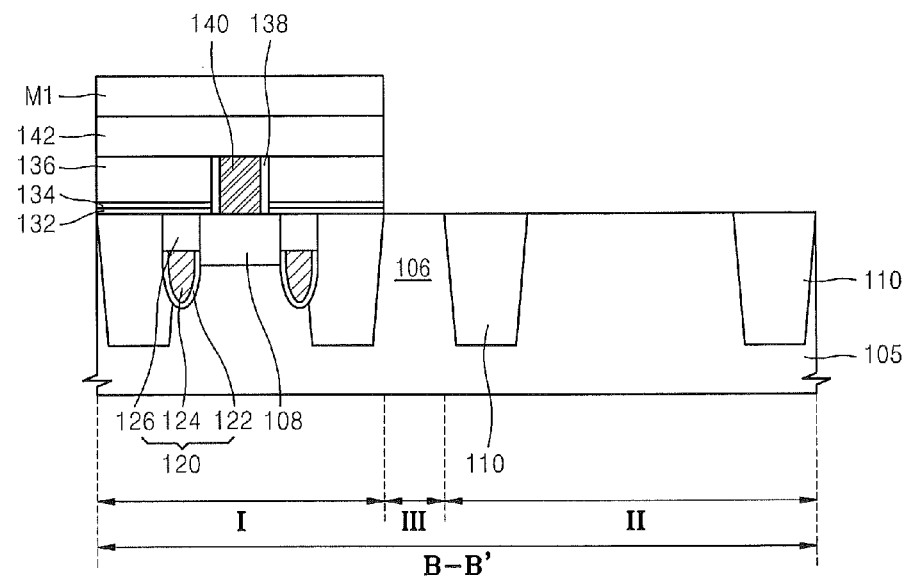
Figure 4K:
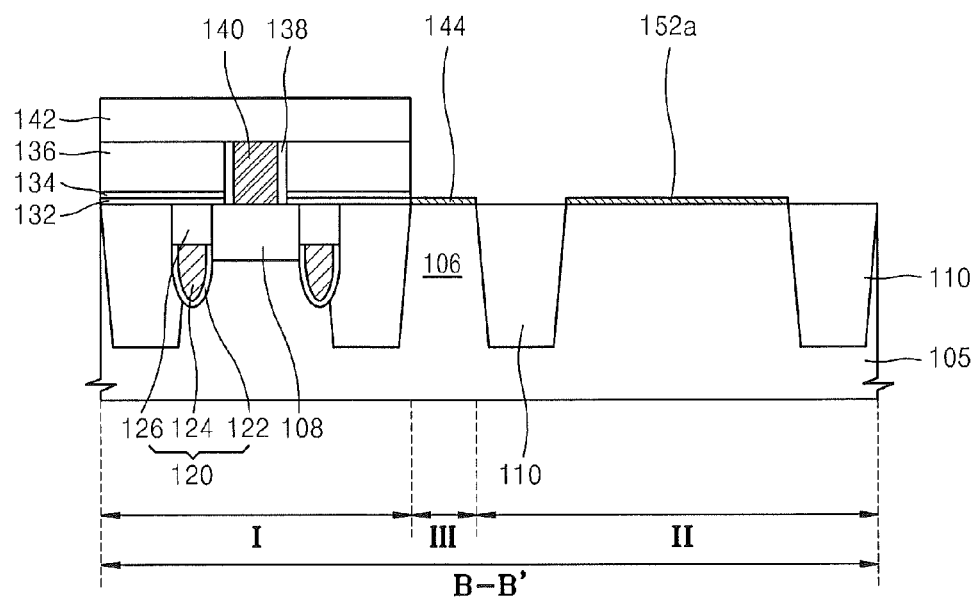
Figure 4L:
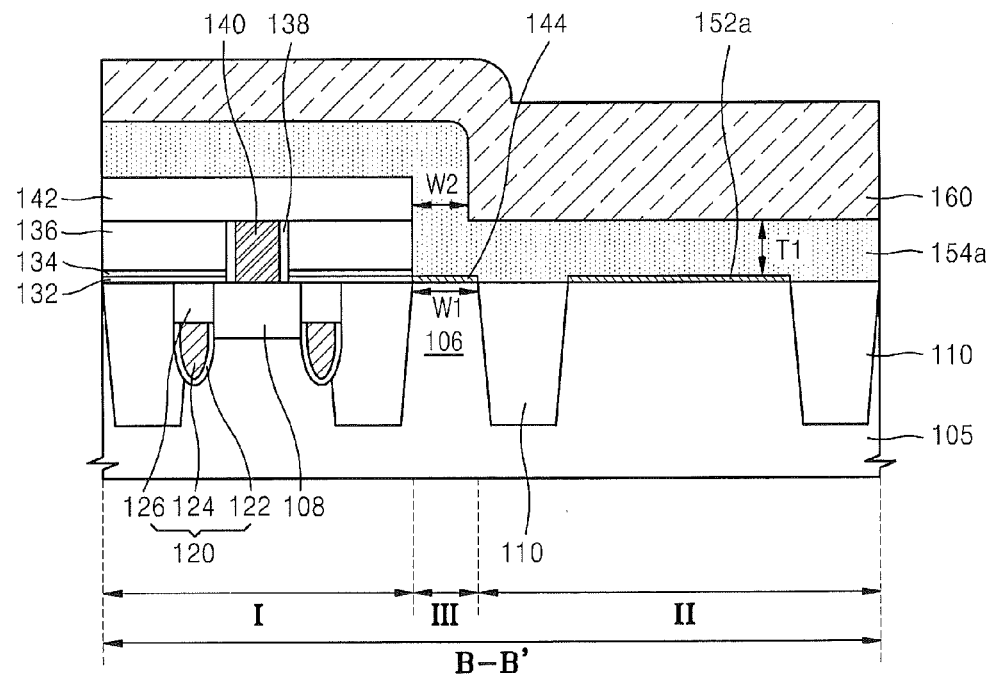
Figure 4M:
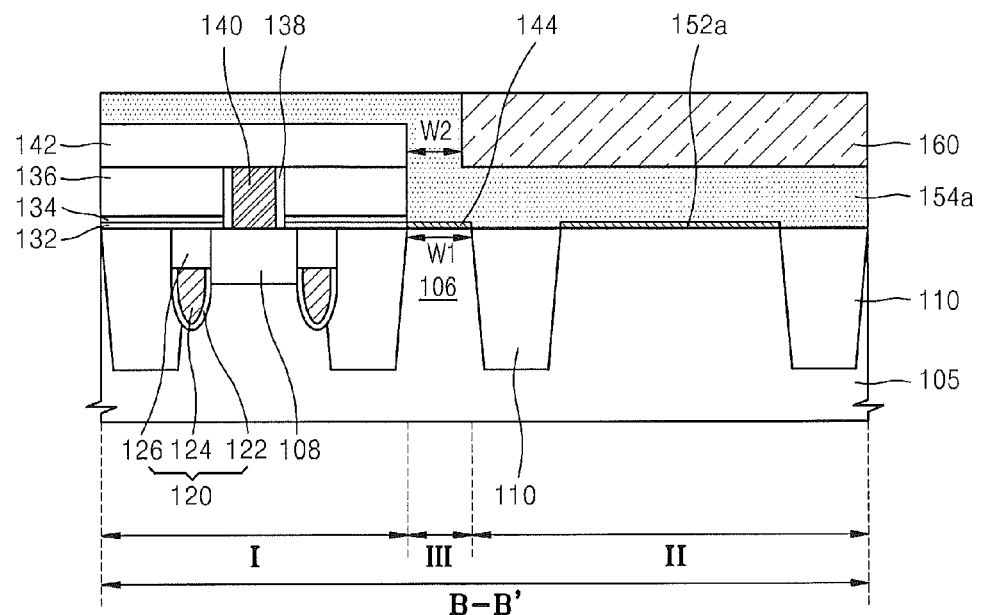
Figure 4N:
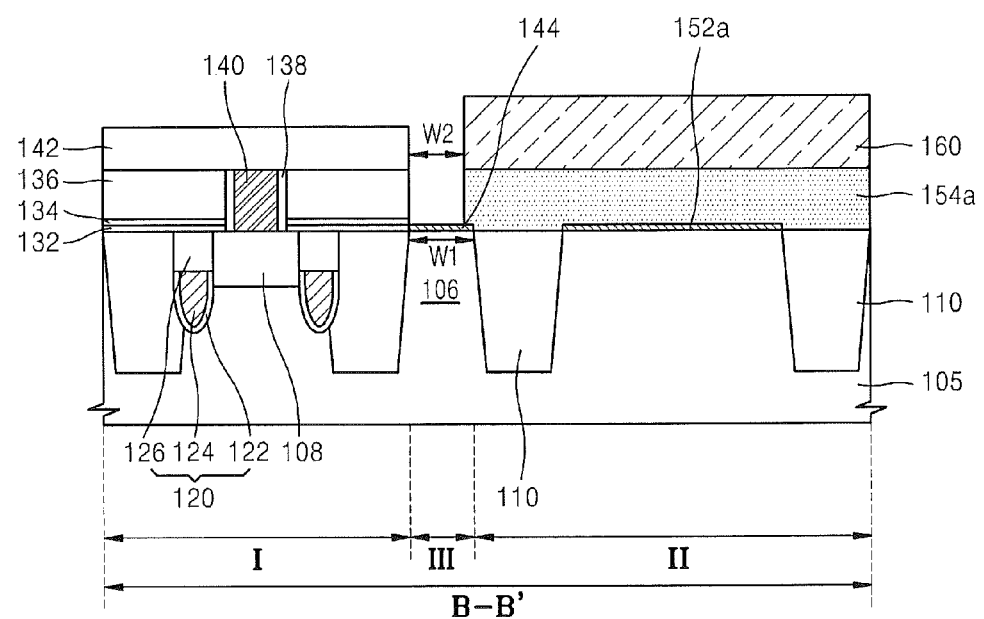
Figure 4O:
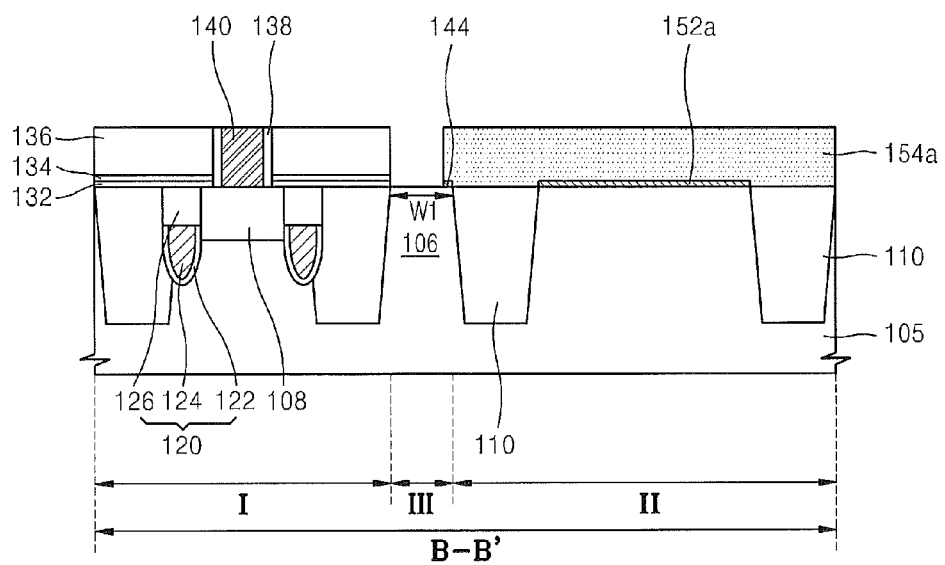
Figure 4P:
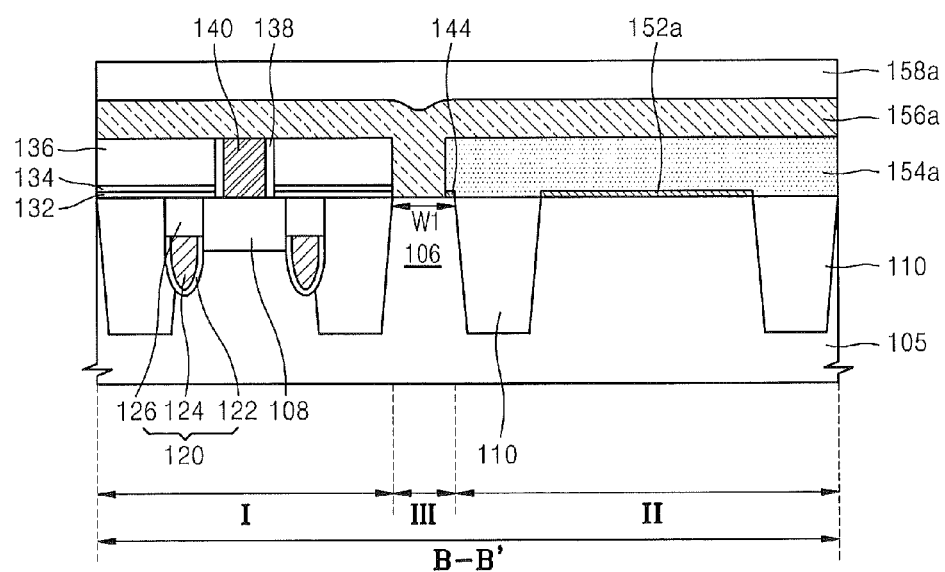
Figure 4Q:
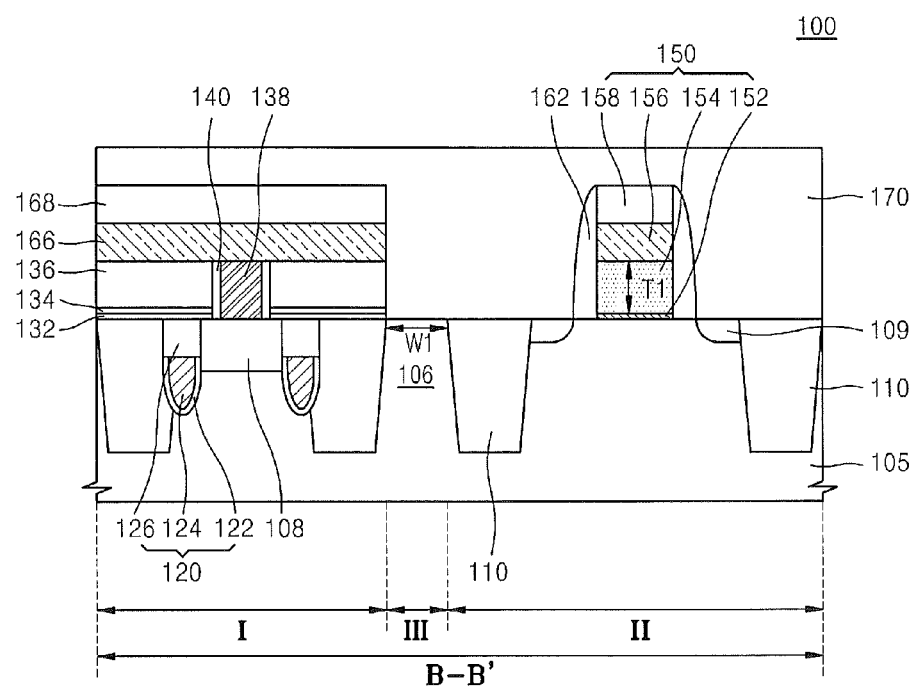

FIGS. 4A through 4Q are cross-sectional views illustrating methods of forming the semiconductor device 100 according to some embodiments of the present inventive concept. FIGS. 4A through 4Q show cross-sections of the semiconductor device 100 taken along line B-B' of FIG. 2A.

Referring to FIG. 4A, the isolation layers 110 defining the active regions and the guard ring 106 may be formed on the substrate 105. The substrate 105 may be a silicon substrate, a silicon-germanium substrate, a silicon-on-insulator (SOI) substrate. The isolation layers 110 may be formed by a shallow trench isolation (STI) process.

The active regions in the cell region I are memory cell formation regions on which buried-type gate structures and memory devices are formed, and the active regions in the peripheral circuit region II are regions on which peripheral circuits such as transistors are formed.

The guard ring 106 may be formed on the interface region III between the cell region I and the peripheral circuit region II. The guard ring 106 may prevent over-etching of the isolation layers 110 in a process of forming a second gate electrode layer (154, refer to FIG. 4H) on the peripheral circuit region II. Accordingly, the width W1 of the guard ring 106 may be greater than a thickness T1 (refer to FIG. 4H) of the second gate electrode layer 154a.

Referring to FIG. 4B, a hard mask 112 may be formed on the substrate 105. The hard mask 112 may be formed by sequentially forming a hard mask layer (not shown) and a photoresist pattern (not shown) on the substrate 105 and then patterning the hard mask layer using the photoresist pattern as an etching mask. The hard mask 112 may be formed of silicon nitride or silicon oxynitride. For example, the hard mask 112 may have a multi-layered structure including silicon oxide and the silicon nitride.

Then, an anisotropic etching process is performed on the substrate 105 using the hard mask 112 as an etching mask to form the trenches 117. In some embodiments, the trenches 117 may be formed by an anisotropic etching process such as a reactive ion etching (RIE) process or a plasma etching process. In addition, an isotropic etching process may be further performed after the anisotropic etching process so as to round lower surfaces of the trenches 117.

Referring to FIG. 4C, the first gate insulating layer 122 is formed on inner walls of the trenches 117 and the hard mask 112. The first gate insulating layer 122 is formed to be thin to be conformally formed on the inner walls of the trenches 117. The first gate insulating layer 122 may be formed of silicon oxide, silicon nitride, and/or a high-k dielectric material. In some embodiments of the present inventive concept, the first gate insulating layer 122 may be formed by a chemical vapor deposition (CVD) process, a plasma enhanced CVD (PECVD) process, a high density plasma CVD (HDP-CVD) process, a sputtering process, a metal organic CVD (MOCVD) process, and/or an atomic layer deposition (ALD) process.

The first gate electrode layer 124a may be formed on the first gate insulating layer 122. The first gate electrode layer 124a may be filled in the trenches 117. In some embodiments of the present inventive concept, the first gate electrode layer 124a may be formed of a metal, a metal nitride, and/or doped polysilicon. When the first gate electrode layer 124a includes a material that is easily diffused, a diffusion barrier layer (not shown) may be formed on the first gate insulating layer 122 and then the first gate electrode layer 124a may be formed on the diffusion barrier layer. The first gate electrode layer 124a may be formed by a CVD process, a PECVD process, an MOCVD process, or an ALD process.

Referring to FIG. 4D, a planarization process of an upper portion of the first gate electrode layer 124a (refer to FIG. 4C) is performed to form the first gate electrode 124 filling lower portions of the trenches 117. In some embodiments of the present inventive concept, an etch-back process and/or a chemical mechanical polishing (CMP) process may be performed on an upper portion of the first gate electrode layer 124a so that the first gate electrode layer 124a may be buried to a predetermined depth in the trenches 117. Accordingly, an upper surface of the first gate electrode 124 may be located at a lower level than that of an upper surface 105A of the substrate 105. The level of the upper surface of the first gate electrode 124 may be determined in consideration of depths of the source and drain regions 107 and 108 (refer to FIG. 2B) that are formed by implanting impurities in subsequent processes. As shown in FIG. 4C, some exposed parts of the first gate insulating layer 122 may be removed during the process of etching the first gate electrode layer 124a, and accordingly upper side walls of the trenches 117 may be exposed.

Referring to FIG. 4E, after removing the hard mask 112, a capping layer 126 filling upper portions of the trenches 117 may be formed on the first gate electrode 124. The capping layer 126 may be formed by forming an insulating layer (not shown) filled the upper portions of the trenches 117, and then, performing planarization of the insulating layer (not shown) until an upper surface of the substrate 105 is exposed. Accordingly, an upper surface of the capping layer 126 may be formed at the same level as that of the upper surface 105A of the substrate 105. The capping layer 126 may protect the first gate electrode 124 and the substrate 105 in subsequent processes. In some embodiments of the present inventive concept, the capping layer 126 may be formed using silicon nitride. Further, a buffer layer (not shown) may be formed on the upper side walls of the trenches 117, which are exposed, before forming the capping layer 126, so that excessive stress due to a direct contact between the capping layer 126 and the substrate 105 may be avoided. In this case, the buffer layer may be formed by an ALD process or a thermal oxidation process.

Accordingly, the first gate structure 120 including the first gate insulating layer 122, the first gate electrode 124, and the capping layer 126 that are sequentially stacked in the trenches 117 on the cell region I may be formed.

A photoresist layer (not shown) is formed to cover the peripheral circuit region II and the interface region III. Then, impurities are injected onto the upper portion of the substrate 105 on the cell region I to form the drain regions 108 between the trenches 117 and the source regions 107 (refer to FIG. 2B) on the outer portions of the trenches 117. The impurities may include n-type impurities such as phosphorous or arsenic, or p-type impurities such as gallium or indium. As described above, an ion implantation energy may be selected so that the lower boundaries of the source and drain regions 107 and 108 may be located at a lower level than that of the upper surface of the first gate electrode 124 in the trenches 117.

Referring to FIG. 4F, the first buffer layer 132, the etch stop layer 134, and the first insulating interlayer 136 covering the entire cell region I, peripheral circuit region II, and the interface region III on the substrate 105 are sequentially formed.

In some embodiments of the present invention, the first buffer layer 132 may be formed of silicon oxide, silicon nitride, or silicon oxynitride. The etch stop layer 134 may be formed of silicon nitride or silicon oxide. The first insulating interlayer 136 may be formed of silicon oxide, silicon nitride, or silicon oxynitride. In some embodiments, the first insulating interlayer 136 may be formed of a material having an etch selectivity with respect to the etch stop layer 134. For example, the first buffer layer 132 and the first insulating interlayer 136 may be formed of the silicon oxide, and the etch stop layer 134 may be formed of the silicon nitride.

Referring to FIG. 4G, the first insulating interlayer 136, the etch stop layer 134, and the first buffer layer 132 on the cell region I may be sequentially etched to form a contact hole 137 exposing the drain region 108. According to some embodiments, a photoresist pattern (not shown) may be formed on the first insulating interlayer 136, and then the first insulating interlayer 136 is patterned until the etch stop layer 134 is exposed using the photoresist pattern as an etching mask. The exposed etch stop layer 134 and the first buffer layer 132 may be removed by a dry-etching process or a wet-etching process.

A contact spacer 138 may be formed on a side wall of the contact hole 137. In some embodiments of the present inventive concept, the contact spacer 138 may be formed by forming a spacer layer (not shown) on the drain region 108 exposed by the contact hole 137, the side wall of the contact hole 137, and the first insulating interlayer 136, and by performing an anisotropic etching process of the spacer layer. The contact spacer 138 may be formed of silicon oxide, silicon nitride, and/or silicon oxynitride. Since the contact spacer 138 is formed on the side wall of the contact hole 137, a width of the bit line contact 140 (refer to FIG. 4H) filled in the contact hole 137 may be reduced.

Referring to FIG. 4H, the bit line contact 140 filled in the contact hole 137 may be formed. The bit line contact 140 may be electrically connected to the drain region 108. According to some embodiments, a conductive layer (not shown) filled in the contact hole 137 is formed on the first insulating interlayer 136, and after that, an upper portion of the conductive layer is planarized until the upper surface of the first insulating interlayer 136 is exposed to form the bit line contact 140. The bit line contact 140 may be formed of doped polysilicon, metal, or metal nitride.

In some embodiments of the present inventive concept, the bit line contact 140 may be formed of polysilicon doped with impurities. In this case, a rapid thermal annealing (RTA) process may be further performed in order to activate the impurities and improve electric conductivity of the bit line contact 140. The RTA process may be performed after forming the bit line contact 140. Otherwise, after forming the bit line contact 140, the RTA process may not be performed. Instead, the RTA process may be performed after forming a second gate electrode layer (154a, refer to FIG. 4L) of the peripheral circuit region II in a post-process so that impurities of the second gate electrode layer 154a and the bit line contact 140 may be activated simultaneously.

In another embodiment, before forming the bit line contact 140, an ohmic layer (not shown) may be formed on an upper portion of the drain region 108 exposed by the contact hole 137, and after that, the bit line contact 140 may be formed on the ohmic layer and the side wall of the contact hole 137. For example, when the bit line contact 140 includes a conductive material such as a metal or a metal nitride, the ohmic layer may be formed to improve the electric conductivity between the substrate 105 and the conductive material. The ohmic layer may be formed of a metal silicide such as titanium silicide and tungsten silicide.

Referring to FIG. 4I, a second buffer layer 142 may be formed on the first insulating interlayer 136 and the bit line contact 140. According to some embodiments, the second buffer layer 142 may be formed of silicon oxide or silicon oxynitride. The second buffer layer 142 may prevent the bit line contact 140 from being oxidized in a post-process for forming the second insulating layer 152.

Referring to FIG. 4J, a photoresist layer M1 covering the cell region I is formed on the second buffer layer 142. The second buffer layer 142, the first insulating interlayer 136, the etch stop layer 134, and the first buffer layer 132 are sequentially etched using the photoresist layer M1 as an etching mask. Accordingly, the second buffer layer 142, the first insulating interlayer 136, the etch stop layer 134, and the first buffer layer 132 formed on the peripheral circuit region II are removed, and the upper surface of the substrate 105 is exposed. In FIG. 4J, the photoresist layer M1 does not overlap the guard ring 106 in a vertical direction, and accordingly the first buffer layer 132, the etch stop layer 134, the first insulating interlayer 136, and the second buffer layer 142 on the guard ring 106 are completely removed. However, the photoresist layer M1 may extend to the upper portion of the guard ring 106, and accordingly, the photoresist layer M1 may overlap with the guard ring 106 in the vertical direction. Here, some parts of the first buffer layer 132, the etch stop layer 134, the first insulating interlayer 136, and the second buffer layer 142 may remain on the guard ring 106.

In some embodiments of the present inventive concept, the second buffer layer 142 and the first insulating interlayer 136 are sequentially removed until the upper surface of the etch stop layer 134 is exposed. After that, a dry-etching process or a strip process using phosphoric acid is performed to remove the etch stop layer 134, and then the first buffer layer 132 may be removed.

Then, the photoresist layer M1 may be removed.

Referring to FIG. 4K, a guard ring insulating layer 144 and an insulating layer 152a are formed respectively on the guard ring 106 and on the peripheral circuit region II of the substrate 105.

The guard ring insulating layer 144 may be formed of silicon oxide, silicon nitride, silicon oxynitride, a high-k dielectric material, or a combination thereof. The guard ring insulating layer 144 may be formed by a CVD process, an ALD process, or a PECVD process.

The insulating layer 152a may be formed of silicon oxide, silicon nitride, silicon oxynitride, a high-k dielectric material, or a combination thereof. The insulating layer 152a may be formed by a CVD process, an ALD process, or a PECVD process. The insulating layer 152a may have a single-layered structure including silicon oxide, or may have a stacked structure including silicon oxide and a high-k dielectric material.

Alternatively, the guard ring insulating layer 144 and the insulating layer 152a may be respectively formed by forming an insulating layer (not shown) on the substrate 105 and patterning the insulating layer. Otherwise, the guard ring insulating layer 144 may be formed first and the insulating layer 152a may be formed, or the insulating layer 152a may be formed first and the guard ring insulating layer 144 may be formed.

Referring to FIG. 4L, the second gate electrode layer 154a may be formed on the substrate 105 to cover the entire cell region I, the peripheral circuit region II, and the interface region III. Accordingly, the second gate electrode layer 154a may be formed on the guard ring insulating layer 144 and the insulating layer 152a on the peripheral circuit region II. In addition, the second gate electrode layer 154a may be conformally formed on an upper surface and a side wall of a stack including the first buffer layer 132, the etch stop layer 134, the first insulating interlayer 136, and the second buffer layer 142 that are sequentially stacked on the cell region I. The thickness T1 of the second gate electrode layer 154a may vary depending on a designed device. In some embodiments, the thickness T1 of the second gate electrode layer 154a may be equal to or less than the width W1 of the guard ring 106.

Since the upper surface of the second buffer layer 142 on the cell region I is formed at a higher level than the upper surface of the substrate 105 of the peripheral circuit region II, the second gate electrode layer 154a on the interface region III may have a stepped portion. The width W2 of the second gate electrode layer 154a on the interface region III may be similar to the thickness T1 of the second gate electrode layer 154a on the peripheral circuit region II. Therefore, the width W2 of the second gate electrode layer 154a on the interface region III may be less than the width W1 of the guard ring 106.

The second gate electrode layer 154a may include a polysilicon layer doped with impurities, and may be formed by a CVD process or an ALD process. According to some embodiments, the second gate electrode layer 154 may be formed by in-situ doping the impurities when the polysilicon layer is formed. Otherwise, the second gate electrode layer 154a may be formed by forming the polysilicon layer and injecting the impurities on the polysilicon layer.

In some embodiments, after forming the second gate electrode layer 154a, an RTA process may be performed to activate the impurities included in the second gate electrode layer 154a. As described above, when the bit line contact 140 includes the polysilicon doped with impurities, an RTA process is not performed after forming the bit line contact 140, and instead, an RTA process is performed after forming the second gate electrode 154a to active the impurities included in the bit line contact 140 and the second gate electrode layer 154a simultaneously. Accordingly, deactivation of the impurities that may occur when the RTA process is performed twice or more may be prevented, and electrical properties of the bit line contact 140 and the second gate electrode layer 154a may be improved.

A third buffer layer 160 is formed on the second gate electrode layer 154a. The third buffer layer 160 may function as a buffer layer in a post planarization process. The third buffer layer 160 may be formed of silicon oxide, silicon nitride, or silicon oxynitride. According to some embodiments, the third buffer layer 160 may be formed of a material having a similar etching property to that of the second buffer layer 142. For example, the third buffer layer 160 may be formed of the substantially same material as that of the second buffer layer 142, and accordingly, the second buffer layer 142 and the third buffer layer 160 may be simultaneously planarized in the post process.

Referring to FIG. 4M, a planarization process is performed on an upper portion of the third buffer layer 160 to expose the upper surface of the second gate electrode layer 154a on the cell region I. Accordingly, an upper portion of the third buffer layer 160 on the peripheral circuit region II may be removed to a predetermined thickness.

For example, the CMP process and/or the etch-back process may be performed on the third buffer layer 160 until the upper surface of the second gate electrode layer 154a on the cell region I is exposed. Accordingly, the third buffer layer 160 remains only on the peripheral circuit region II, and the upper surface of the third buffer layer 160 may be located on substantially the same plane as the upper surface of the second gate electrode layer 154a on the cell region I.

Referring to FIG. 4N, the exposed parts of the second gate electrode layer 154a on the cell region I and on the interface region III are removed. According to some embodiments of the present inventive concept, the exposed parts of the second gate electrode layer 154a may be selectively removed by the wet-etching process. The wet-etching process may be performed using an etchant that may selectively etch a polysilicon material. The second buffer layer 142, the guard ring insulating layer 144, and the third buffer layer 160 may function as etch stop layers. Accordingly, an upper surface of the second buffer layer 142 on the cell region I is exposed, and an upper surface of the third buffer layer 160 on the peripheral circuit region II is exposed.

A portion of the second gate electrode 154a that is exposed on the interface region III may be removed until the upper surface of the guard ring insulating layer 144 is exposed. The width W2 of the second gate electrode 154a exposed on the interface region III may be less than the width W1 of the guard ring 106, and the guard ring insulating layer 144 may be formed on an entire surface of the guard ring 106. Thus, the guard ring insulating layer 144 may function as an etch stop layer, and the upper portion of the guard ring 106 may not be etched.

When the planarization and the wet-etching processes are performed, it is not required to perform an additional photoresist process for defining the peripheral circuit region II, thereby simplifying the processes.

Referring to FIG. 4O, the second buffer layer 142 (refer to FIG. 4M) and the third buffer layer 160 (refer to FIG. 4M) may be removed. Here, the guard ring insulating layer 144 (refer to FIG. 4M) exposed on the interface region III is removed, and the upper surface of the guard ring 106 may be exposed again. The above removal may be performed by using a dry-etching process or a wet-etching process. For example, when the second buffer layer 142, the third buffer layer 160, and the guard ring insulating layer 144 include silicon oxide, the wet-etching process may be performed by using an etchant having an etch selectivity with respect to the silicon oxide to remove the second buffer layer 142, the third buffer layer 160, and the guard ring insulating layer 144. Here, the guard ring 106 on the interface region III may function as an etch stop layer.

Referring to FIG. 4P, a third gate electrode layer 156a and a hard mask layer 158a are sequentially formed on the first insulating interlayer 136, the guard ring 106, and the second gate electrode layer 154a. According to some embodiments of the present inventive concept, the third gate electrode layer 156a may be formed of metal, metal nitride, or doped polysilicon. The third gate electrode layer 156a may have a single-layered structure or a multi-layered structure. In addition, when the second gate electrode layer 154a includes polysilicon and the third gate electrode layer 156a includes a metal or a metal nitride, an ohmic layer (not shown) may be formed on the second gate electrode layer 154a and then the third gate electrode layer 156a may be formed on the ohmic layer. For example, the third gate electrode layer 156a may have a multi-layered structure including a tungsten suicide layer, a titanium nitride layer, a tungsten silicide layer, and a tungsten layer. The hard mask layer 158a may be formed of silicon nitride.

Referring to FIG. 4Q, a photoresist pattern (not shown) is formed on the hard mask layer 158a (refer to FIG. 4P). Then, the hard mask layer 158a, the second gate electrode layer 154a (refer to FIG. 4P), and the second gate insulating layer 152a (refer to FIG. 4P) are sequentially patterned by using the photoresist pattern as an etching mask to form the second gate structure 150. The second gate structure 150 may include the second gate insulating layer 152, the second gate electrode 154, the third gate electrode 156, and the hard mask 158 that are sequentially stacked on the peripheral circuit region II of the substrate 105.

The hard mask layer 158a and the third gate electrode layer 156a on the cell region I may be sequentially patterned to form the bit line 166 and the hard mask 168 that are electrically connected to the bit line contact 140.

According to some embodiments of the present inventive concept, the second gate structure 150 and the bit line 166 may be simultaneously formed. For example, when the third gate electrode layer 156a is patterned using an etchant having an etch selectivity with respect to polysilicon, the upper surface of the first insulating interlayer 136 may be exposed on the cell region I after forming the bit line 166, and the upper surface of the second gate electrode layer 154a may be exposed on the peripheral circuit region II after forming the third gate electrode 156. When the second gate electrode layer 154a includes the polysilicon, the second gate electrode 154a may be etched, and the first insulating interlayer 136 may be hardly etched. Here, the third gate electrode layer 156a on the interface region III may also be removed.

FIG. 4Q illustrates the process of patterning the second gate structure 150 and the bit line 166 simultaneously; however, the second gate structure 150 and the bit line 166 may be patterned sequentially. In this case, the third gate electrode 156 and the bit line 166 may be formed of different materials from each other.

Then, a spacer layer (not shown) covering the second gate structure 150 may be formed, and an anisotropic etching process may be performed on the spacer layer to form the spacer 162 on the side wall of the second gate structure 150.

An impurity region 109 may be formed at an upper portion of the substrate 105, which is adjacent to the second gate structure 150 and the spacer 162, using the second gate structure 150 and the spacer 162 as an ion implantation masks. The second gate structure 150 and the impurity region 109 may form a transistor.

A second insulating interlayer 170 covering the second gate structure 150, the spacer 162, the first insulating interlayer 136, the bit line 166, and the hard mask 168 is formed.

Referring back to FIG. 2B, the storage node contacts 172 penetrating through the first and second insulating layers 136 and 170 may be formed on the source regions 107. The storage regions 174 such as capacitors may be formed on the storage node contacts 172, and the storage node contacts 172 may electrically connect the source regions 107 and the storage regions 174 to each other. Although not shown in FIG. 2B, when the storage region 174 is a capacitor, a lower electrode (not shown) formed as a cylinder, a dielectric layer (not shown) surrounding the lower electrode, and an upper electrode (not shown) covering the dielectric layer may be formed. However, the storage region 174 is not limited thereto.

Through the above described processes, the semiconductor device 100 is manufactured.

According to the method of manufacturing the semiconductor device 100 of the present inventive concept, the guard ring 106 is formed on the interface region III between the cell region I and the peripheral circuit region II, and the process of patterning the second gate electrode 154 may be performed easily by using the guard ring 106. In addition, after forming the bit line contact 140 on the cell region I, the second gate structure 150 is formed on the peripheral circuit region II. In the process of forming the second gate structure 150, the second gate electrode layer including polysilicon is formed, and after that, an RTA process may be simultaneously performed. Therefore, deactivation of the impurities included in the second gate electrode layer may be prevented, and accordingly, the electrical characteristics of the semiconductor device including the second gate structure may be improved.

FIGS. 5A through 5H are cross-sectional views illustrating methods of forming a semiconductor device according to further embodiments of the present inventive concept. The methods illustrated in FIGS. 5A through 5H are used to manufacture the semiconductor device 100a described with reference to FIGS. 3A and 3B. The methods are similar to the method described with reference to FIGS. 4A through 4Q, except that the recess 106a is formed on the isolation layer 110 instead of forming the guard ring 106.

Figure 5A:
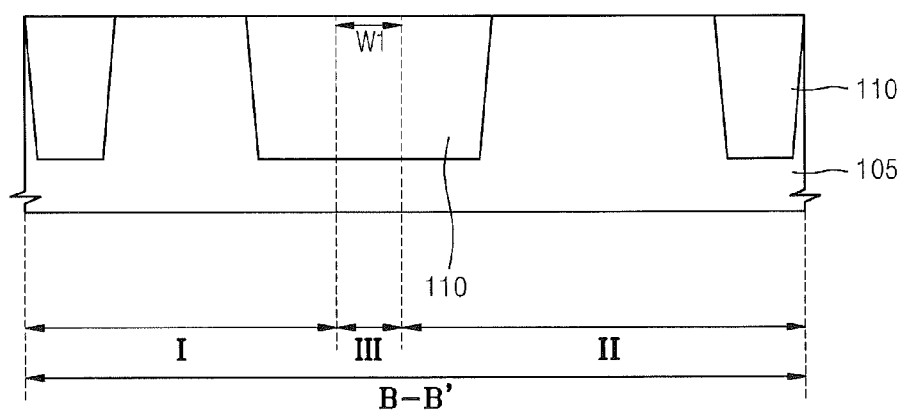
FIGS. 5A through 5H are cross-sectional views illustrating methods of forming a semiconductor device according to further embodiments of the present inventive concept.

Referring to FIG. 5A, the isolation layers 110 defining the active regions are formed on the substrate 105. The isolation layers 110 are formed on the interface region III between the cell region I and the peripheral circuit region II. The interface region III may have a predetermined width W1 and may surround the cell region I (refer to FIG. 3A).

Figure 5B:
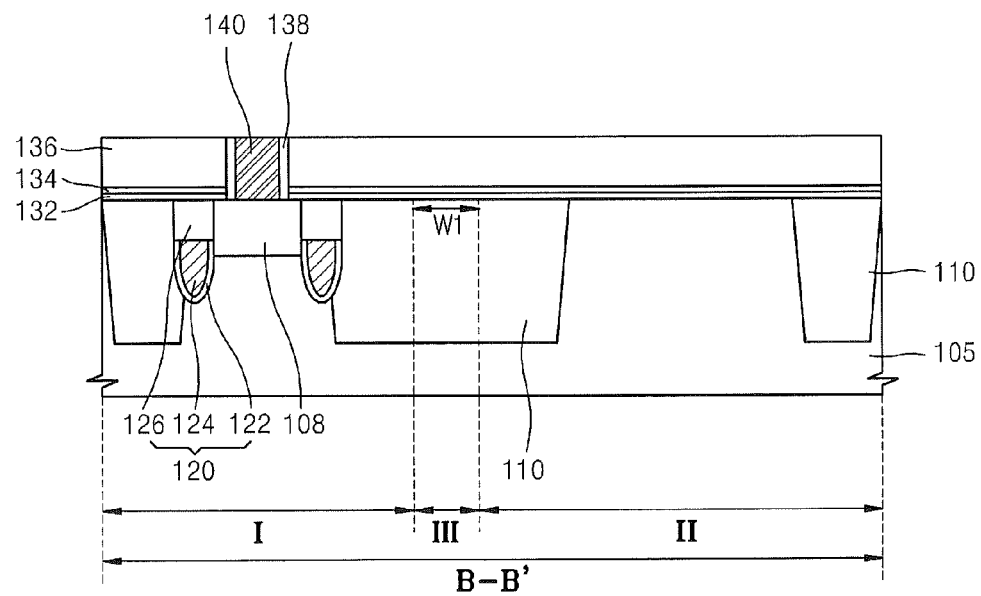

Referring to FIG. 5B, the processes illustrated in FIGS. 4B through 4H are performed so that the first gate structure 120 is formed on the cell region I, and the first buffer layer 132, the etch stop layer 134, and the first insulating interlayer 136 are formed on the entire regions I, II, and III on the substrate 105. Then, the bit line contact 140 penetrating through the first insulating interlayer 136, the etch stop layer 134, and the first buffer layer 132 is formed on the cell region I. On the other hand, a contact spacer 138 may be further formed on the side wall of the bit line contact 140.

Figure 5C:
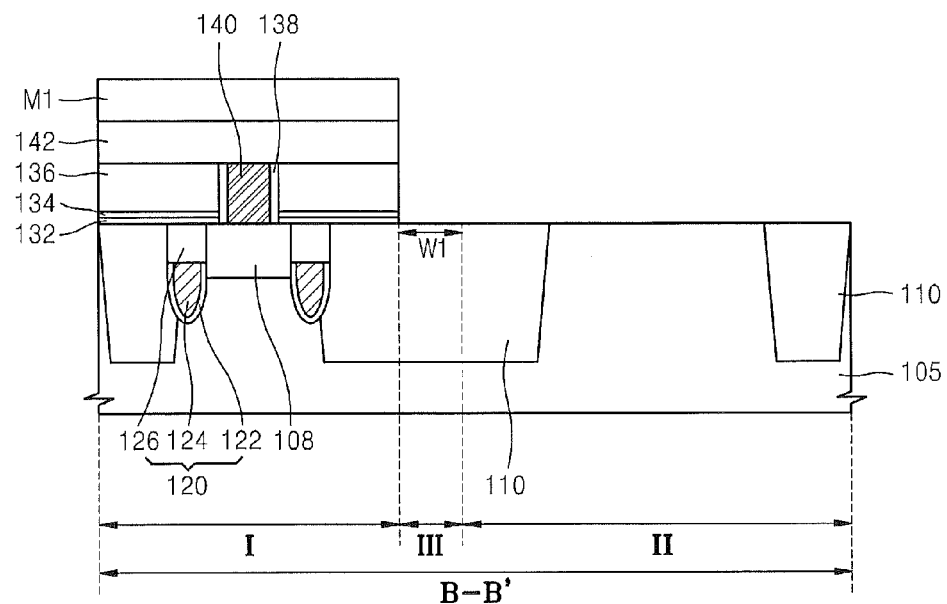

Referring to FIG. 5C, the second buffer layer 142 covering the bit line contact 140 and the first insulating interlayer 136 is formed. A photoresist layer M1 covering the cell region I is formed, and then, the second buffer layer 142, the first insulating interlayer 136, the etch stop layer 134, and the first buffer layer 132 on the peripheral circuit region II and the interface region III are sequentially removed.

Figure 5D:
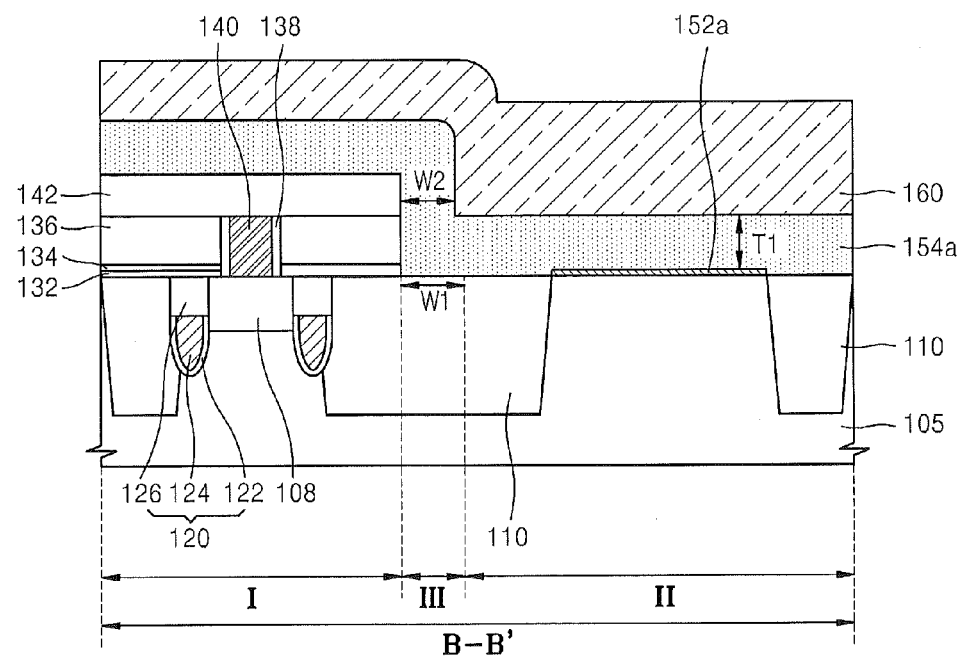

Referring to FIG. 5D, the insulating layer 152a is formed on the peripheral circuit region II of the substrate 105, and the second gate electrode layer 154a covering the entire regions I, II, and III of the substrate 105 is formed. The second gate electrode layer 154a may be conformally formed on an upper surface and a side wall of a stack including the first buffer layer 132, the etch stop layer 134, the first insulating interlayer 136, and the second buffer layer 142 that are sequentially stacked on the cell region I to a predetermined width W2. A thickness T1 of the second gate electrode layer 154a may vary depending on the device that is designed. The thickness T1 of the second gate electrode layer 154a may be equal to or less than the width W1 of the interface region III.

Since the upper surface of the second buffer layer 142 on the cell region I is formed at a higher level than that of the upper surface of the substrate 105 on the peripheral circuit region II, the second gate electrode layer 154a may have a stepped portion on the interface region III. On the interface region III, the width W2 of the second gate electrode layer 154a may be similar to the thickness T1 of the second gate electrode layer 154a on the peripheral circuit region II. Therefore, the width W2 of the second gate electrode layer 154a on the interface region III may be less than the width W1 of the interface region III.

After that, the third buffer layer 160 may be formed on the second gate electrode layer 154a. The third buffer layer 160 may function as a buffer layer in a post planarization process.

Figure 5E:
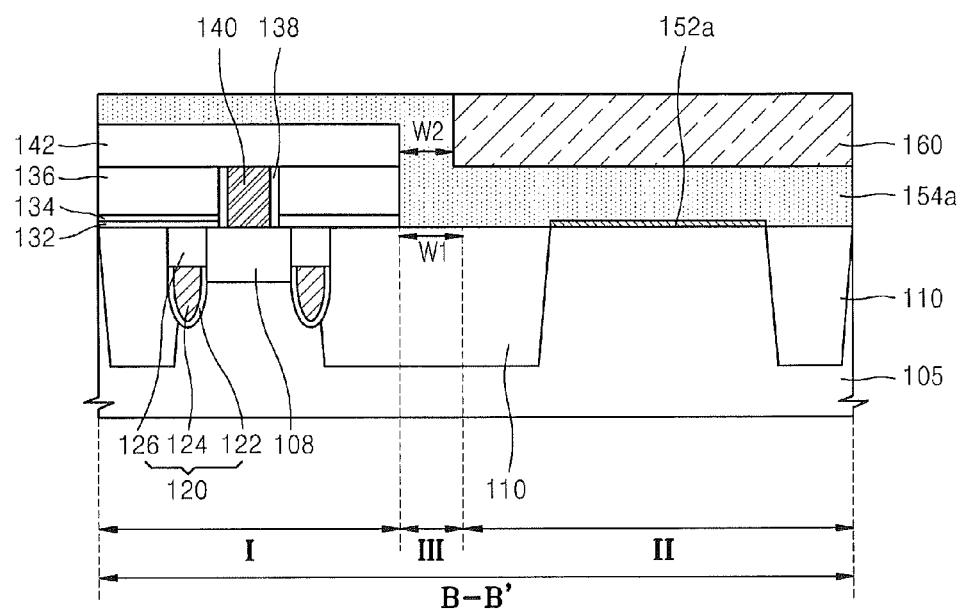

Referring to FIG. 5E, a planarization process is performed on an upper portion of the third buffer layer 160 to expose the upper surface of the second gate electrode 154a on the cell region I. Accordingly, an upper portion of the third buffer layer 160 located on the peripheral circuit region II may be removed to a predetermined thickness.

For example, a CMP process and/or an etch-back process may be performed on the upper portion of the third buffer layer 160 until the upper surface of the second gate electrode layer 154a on the cell region I is exposed. Accordingly, the third buffer layer 160 may remain only on the peripheral circuit region II, and the upper surface of the third buffer layer 160 may be located on the same plane as that of the upper surface of the second gate electrode layer 154a on the cell region I.

Figure 5F:
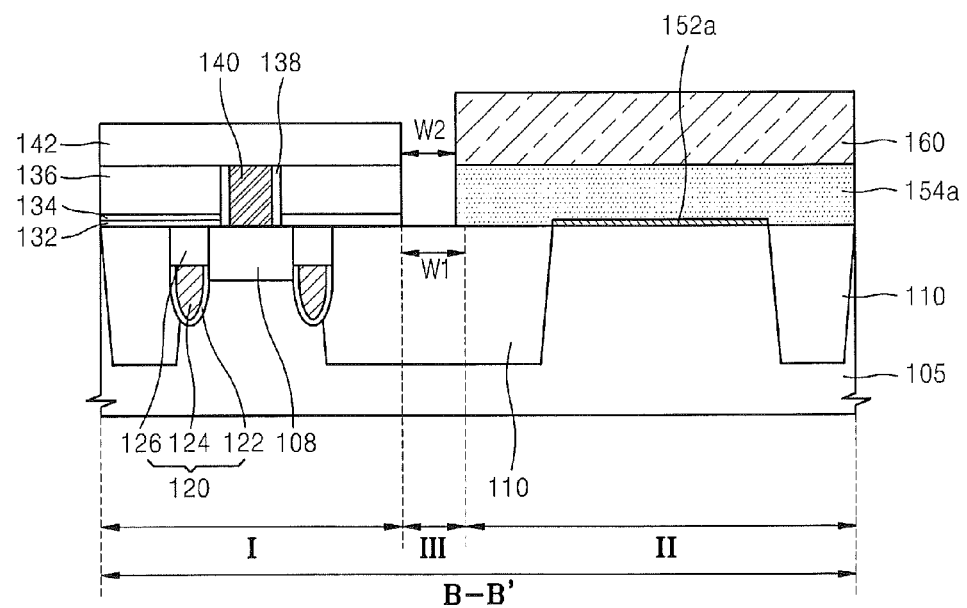

Referring to FIG. 5F, the exposed portion of the second gate electrode layer 154a on the cell region I and the interface region III is removed. According to some embodiments, the exposed portion of the second gate electrode 154a may be selectively removed by a wet-etching process. The wet-etching process may be performed using an etchant that may selectively etch polysilicon. The second buffer layer 142, the isolation layers 110, and the third buffer layer 160 may function as etch stop layers. Accordingly, the upper surface of the second buffer layer 142 on the cell region I is exposed, and the upper surface of the third buffer layer 160 on the peripheral circuit region II is exposed.

When the planarization process and the wet-etching process are performed, there is no need to perform an additional photoresist process for defining the peripheral circuit region II, and thus processes may be simplified.

Figure 5G:
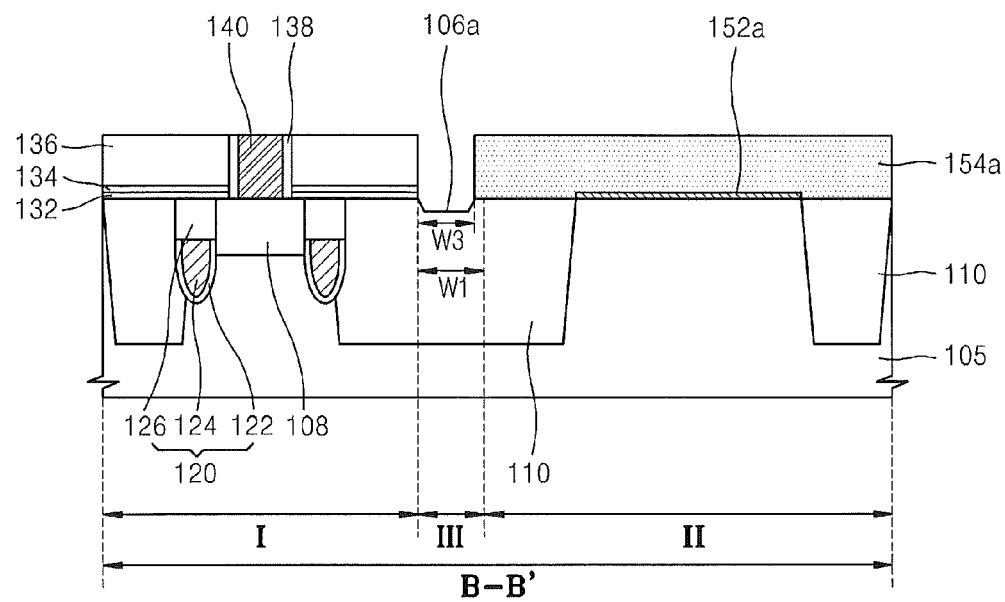

Referring to FIG. 5G, the second buffer layer 142 and the third buffer layer 160 are removed by a dry-etching process or a wet-etching process. Here, the upper portions of the isolation layers 110, which are exposed on the interface region III, may be etched to form the recesses 106a. A width W3 of each of the recesses 106a may be equal to or greater than the width W2 of the second gate electrode layer 154a on the interface region III.

Figure 5H:
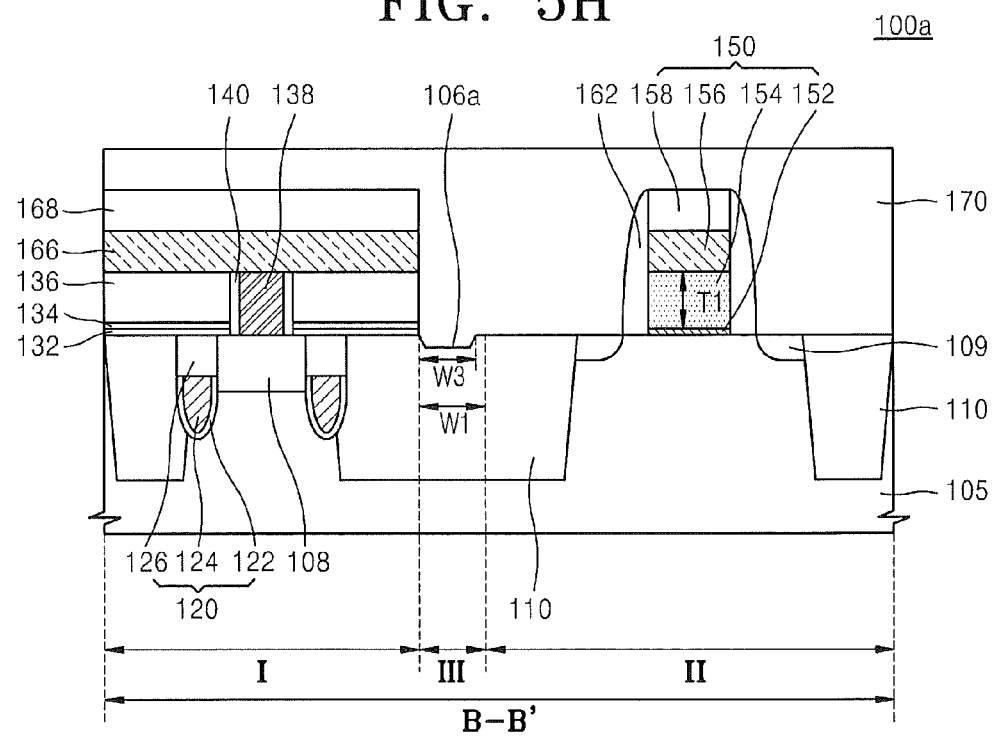

Referring to FIG. 5H, the processes illustrated in FIGS. 4P and 4Q are then performed to form the second gate structure 150 including the second gate insulating layer 152, the second gate electrode 154, the third gate electrode 156, and the hard mask 158 that are sequentially stacked on the peripheral circuit region II of the substrate 105. In addition, the bit line 166 that is electrically connected to the bit line contact 140 and the hard mask 168 may be formed on the first insulating interlayer 136 on the cell region I.

Then, the second insulating interlayer 170 covering the second gate structure 150, the spacer 162, the first insulating interlayer 136, the bit line 166, and the hard mask 168 is formed.

Referring back to FIG. 3B, the storage node contacts 172 penetrating through the first and second insulating interlayers 136 and 170 may be formed. The storage regions 174 such as the capacitors may be formed on the storage node contacts 172, and the storage node contacts 172 may electrically connect the source regions 107 and the storage regions 174 to each other.

Through the above processes, the semiconductor device 100a is manufactured.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
   a substrate including a cell region, a peripheral circuit region, and an interface region between the cell region and the peripheral circuit region;
   a guard ring formed in the interface region of the substrate and surrounding the cell region, wherein the guard ring comprises a portion of the substrate at an upper surface of the substrate and is defined by two adjacent isolation layers at the upper surface of the substrate;
   a first gate structure in the cell region; and
   a second gate structure in the peripheral circuit region.

2. The semiconductor device of claim 1, wherein an upper surface of the guard ring is formed at the same level as an upper surface of the substrate, and wherein a side wall of the guard ring contacts a side wall of an isolation layer that surrounds the cell region.

3. The semiconductor device of claim 1, wherein the interface region has a predetermined width, and wherein the guard ring is formed at an entire portion of the interface region.

4. The semiconductor device of claim 1, wherein the first gate structure comprises:
   a first gate insulating layer on an inner wall of a trench in the substrate;
   a first gate electrode on the first gate insulating layer, and an upper surface of which is located at a lower level than an upper surface of the substrate; and
   a capping layer on the first gate electrode; and
   wherein the second gate structure comprises:
   a second gate insulating layer on the substrate;
   a second gate electrode on the second gate insulating layer; and
   a third gate electrode on the second gate electrode.

5. The semiconductor device of claim 4, further comprising:
   a bit line contact electrically connected to an impurity region that is adjacent to the first gate structure; and
   a bit line electrically connected to the bit line contact.

6. The semiconductor device of claim 5, wherein the bit line comprises a substantially same material as a material of the third gate electrode.

7. The semiconductor device of claim 4, wherein a width of the guard ring is greater than a thickness of the second gate electrode.

8. The semiconductor device of claim 5, wherein the bit line has a thickness that is substantially the same as a thickness of the third gate electrode.

9. A semiconductor device comprising:
a substrate including a cell region, a peripheral circuit region, and an interface region between the cell region and the peripheral circuit region and surrounding the cell region;
an isolation layer within the substrate in the interface region, wherein a recess is formed in the isolation layer in the interface region;
a plurality of first gate structures in the cell region; and
a second gate structure in the peripheral circuit region.

10. The semiconductor device of claim 9, wherein the recess is formed in an upper portion of the isolation layer.

11. The semiconductor device of claim 10, wherein the recess has a predetermined depth from an upper surface of the substrate in a vertical direction.

12. The semiconductor device of claim 10, wherein a width of the recess is less than or equal to a width of the interface region.

13. The semiconductor device of claim 10, wherein the second gate structure comprises a gate insulating layer, a first gate electrode, and a second gate electrode that are sequentially formed on the substrate.

14. The semiconductor device of claim 13, wherein a width of the recess is greater than or equal to a thickness of the first gate electrode.

15. A semiconductor device comprising:
a substrate including a cell region and a peripheral circuit region;
an etch stop structure surrounding the cell region and defining an interface region between the cell region and the peripheral circuit region, wherein the etch stop structure comprises a portion of the substrate defined by two adjacent trench isolation layers surrounding the cell region;
a first gate structure in the cell region; and
a second gate structure in the peripheral circuit region.

16. The semiconductor device of claim 15, wherein the etch stop structure comprises a recess in the at least one trench isolation layer.

17. The semiconductor device of claim 15, wherein the etch stop structure comprises a planar portion of the substrate between the at least one trench isolation layer and a second trench isolation layer surrounding the cell region.

18. The semiconductor device of claim 17, wherein the second gate structure comprises a gate insulating layer on the substrate, a first gate electrode on the second gate insulating layer and a second gate electrode on the first gate electrode;
wherein a width of the etch stop structure is greater than a thickness of the first gate electrode.

19. The semiconductor device of claim 17, wherein the second gate structure comprises a gate insulating layer on the substrate, a first gate electrode on the second gate insulating layer and a second gate electrode on the first gate electrode;
wherein a width of the etch stop structure is greater than a thickness of the first gate electrode.

* * * * *